(12) United States Patent
Yamaguchi et al.

(10) Patent No.: US 6,274,908 B1
(45) Date of Patent: *Aug. 14, 2001

(54) SEMICONDUCTOR DEVICE HAVING INPUT-OUTPUT PROTECTION CIRCUIT

(75) Inventors: Yasuo Yamaguchi; Takashi Ippooshi, both of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,634

(22) Filed: Apr. 8, 1998

(30) Foreign Application Priority Data

Oct. 9, 1997 (JP) .................................... 9-277133

(51) Int. Cl.⁷ ....................................... H02H 9/00
(52) U.S. Cl. .................. 257/355; 257/173; 257/174; 257/328; 257/487; 257/356; 257/357; 257/358; 257/359; 257/360; 257/546
(58) Field of Search ...................... 257/173, 174, 257/328, 355–363, 487–496, 546

(56) References Cited

U.S. PATENT DOCUMENTS

| | | |
|---|---|---|
| 4,989,057 | 1/1991 | Lu . |
| 5,610,426 | 3/1997 | Asai et al. . |
| 5,610,790 | * 3/1997 | Staab et al. .............................. 361/56 |
| 5,818,086 | * 10/1998 | Lin et al. ................................ 257/355 |

FOREIGN PATENT DOCUMENTS

| | | |
|---|---|---|
| 196 51 247 | 10/1997 | (DE) . |
| 000280236 | * 4/1988 | (EP) .................................... 257/360 |
| 0 444 686 | 9/1991 | (EP) . |
| 0 471 310 | 2/1992 | (EP) . |
| 2-260459 | 10/1990 | (JP) . |
| 7-202010 | 8/1995 | (JP) . |
| 8-195443 | 7/1996 | (JP) . |
| WO 96/22613 | 7/1996 | (WO) . |

OTHER PUBLICATIONS

Claims of the 09/038,144 Application.

* cited by examiner

*Primary Examiner*—Fetsum Abraham
(74) *Attorney, Agent, or Firm*—Oblon, Spivak, McClelland, Maier & Neustadt, P.C.

(57) ABSTRACT

A semiconductor device having a SOI structure in which an ESD resistance can be enhanced is obtained. The semiconductor device comprises PMOS transistors Q21 and Q22 which are brought into a forward bias state if a positive high voltage is applied as a surge voltage to a signal terminal 30, and NMOS transistors Q11 and Q12 which are brought into the forward bias state if a negative high voltage is applied as the surge voltage to the signal terminal 30. Furthermore, if a normal operation signal is applied from the signal terminal 30, all the NMOS transistors Q11 and Q12 and the PMOS transistors Q21 and Q22 are brought into an OFF state.

18 Claims, 22 Drawing Sheets

SEMICONDUCTOR DEVICE HAVING INPUT-OUTPUT PROTECTION CIRCUIT

BACKGROUND OF THE INVENTION

1. Field of the Invention

The present invention relates to a semiconductor device having a MOS transistor formed on a SOI substrate, and more particularly to an input-output protecting function thereof.

2. Description of the Background Art

In the case where a MOS device is formed on a bulk silicon substrate, a surge can be discharged into the substrate through a PN junction. In a SOI (Silicon-on-insulator) device in which the MOS device is formed on a SOI layer provided on a buried insulation layer, a path for transferring the surge does not structurally exist on the substrate because the buried insulation layer is formed. In particular, a longitudinal discharge path does not exist in a thin film SOI structure in which source and drain regions of a MOS transistor reach a buried oxide film. Consequently, it is structurally necessary to perform a transverse discharge. For this reason, the discharge is transversely performed into a power line and a grounding line through the MOS transistor and a diode.

FIG. 31 is a circuit diagram showing a structure of an input-output protecting circuit having a SOI structure according to the prior art. As shown in FIG. 31, one of ends of a resistor 36 (hereinafter referred to as a "protecting resistor") for limiting a rush current is first connected to a signal terminal 30 to delay propagation of a surge voltage to an inside through the signal terminal 30, thereby preventing an excessive current from flowing. Then, a PMOS transistor Q31 and an NMOS transistor Q32 are provided in series as discharge elements for transferring electric charges between a power supply (node) 32 and a ground level (node) 33. The PMOS transistor Q31 and the NMOS transistor Q32 have gates connected to the power supply 32 and the ground level 33, and drains connected to the other end of the protecting resistor 36 in common, respectively. Accordingly, the PMOS transistor Q31 and the NMOS transistor Q32 are usually brought into an OFF state.

In the case where the surge voltage is applied to the signal terminal 30, the electric charges are quickly discharged into the power supply 32 or the ground level 33 by avalanche breakdown of each of the MOS transistors Q31 and Q32 to protect an internal element 31. Furthermore, the other end of the protecting resistor 36 is connected to one of ends of an internal resistor 37, and the internal element 31 is connected to the other end of the internal resistor 37. Consequently, the surge voltage is propagated to the internal element 31 with difficulty.

FIG. 32 shows an input-output protecting circuit formed by using diodes 38 and 39 as discharge elements in the same manner. As shown in FIG. 32, one of ends of a protecting resistor 36 is first connected to a signal terminal 30 to delay propagation of a surge voltage to an inside through the signal terminal 30, thereby preventing an excessive current from flowing. Then, the diodes 38 and 39 are provided in series as discharge elements for transferring electric charges between a power supply 32 and a ground level 33. A cathode of the diode 38 is connected to the power supply 32, and an anode of the diode 39 is connected to the ground level 33. Accordingly, the diodes 38 and 39 are connected in reverse directions between the power supply 32 and the ground level 33.

If the surge voltage is applied to the signal terminal 30, the electric charges are quickly discharged into the power supply 32 or the ground level 33 by backward avalanche breakdown of the diodes 38 and 39 or a forward current, thereby protecting an internal element 31. Furthermore, an internal resistor 37 is inserted between the protecting resistor 36 and the internal element 31 to propagate the surge voltage to the internal element 31 with difficulty.

FIG. 33 shows an inverter circuit acting as one of typical internal circuits. As shown in FIG. 33, a PMOS transistor Q33 and an NMOS transistor Q34 are connected in series between a power supply 32 and a ground level 33. The PMOS transistor Q33 and the NMOS transistor Q34 have gates connected to an input signal terminal 82 in common, and drains connected to an output signal terminal 83 in common.

In the case where the input-output protecting circuits having the structures shown in FIGS. 31 and 32 are connected to the input signal terminal 82 (an input section of the internal circuit) for the internal circuit shown in FIG. 33, they function as input protecting circuits. In the case where the same input-output protecting circuits are connected to the output signal terminal 83 (an output section of the internal circuit), they function as output protecting circuits. The function and operation of the protecting circuit are the same in the input and output sections. Therefore, the protecting circuit will be hereinafter referred to as an "input-output protecting circuit". If the protecting circuit is used as the output protecting circuit, no resistor is often added thereto.

FIG. 34 is a plan view showing a planar structure of the MOS input-output protecting circuit shown in FIG. 31, and FIG. 35 is a sectional view taken along the line A—A shown in FIG. 34. As shown in FIGS. 34 and 35, a thin silicon film 3 acting as a SOI layer is provided on a silicon substrate 1 with a buried oxide film 2 acting as an insulation layer interposed therebetween. The thin silicon film 3 is divided into two islands 18A and 18B by an interlayer dielectric film 11. Channel formation regions 6 and 6d into which an impurity having a concentration of about $10^{17}/cm^3$ (p-type in NMOS and n-type in PMOS) is implanted are provided, drain and source regions 7 and 8 into which an impurity having a concentration of about $10^{20}/cm^3$ (n-type in NMOS and p-type in PMOS) is implanted are provided with the channel formation region 6 interposed therebetween, and drain and source regions 7d and 8d into which an impurity having a concentration of about $10^{20}/cm^3$ is implanted are provided with the channel formation region 6d interposed therebetween. Furthermore, gate electrodes 5 and 5d are formed on the channel formation regions 6 and 6d and a part of each of the drain regions 7 and 7d and the source regions 8 and 8d in the thin silicon film 3 with gate oxide films 4 and 4d interposed therebetween, respectively. Accordingly, the NMOS transistor Q32 is formed by the gate oxide film 4, the gate electrode 5, the channel formation region 6, the drain region 7 and the source region 8 in the island 18A, and the PMOS transistor Q31 is formed by the gate oxide film 4d, the gate electrode 5d, the channel formation region 6d, the drain region 7d and the source region 8d in the island 18B.

Furthermore, the interlayer dielectric film 11 divides the thin silicon film 3 into the islands 18A and 18B and is formed over the whole surface of the thin silicon film 3. Contact holes 12A to 12D are provided on the interlayer dielectric film 11 in a part of each of the drain regions 7 and 7d and the source regions 8 and 8d. An aluminum wiring 14 is electrically connected to the drain regions 7 and 7d through the contact holes 12A and 12B, an aluminum wiring 13 is electrically connected to the source region 8 through the contact hole 12C, and an aluminum wiring 15 is electrically connected to the source region 8d through the contact hole 12D. The aluminum wiring 13 is connected to a ground level 33, the aluminum wiring 14 is connected to an input section 30d, and the aluminum wiring 15 is connected to a power supply 32. The input section 30d means a portion to be connected to the other end of the protecting resistor 36 as shown in FIG. 32. In FIG. 34, the interlayer dielectric film 11 is omitted.

As shown in FIG. 34, the protecting resistor 36 formed of a gate electrode material and a thin silicon film is provided between the signal terminal 30 and the PMOS transistor Q31 and NMOS transistor Q32 which act as discharge elements, and the internal resistor 37 formed of the gate electrode material and the thin silicon film is provided between the discharge elements Q31 and Q32 and the internal element 31. The protecting resistor 36 is usually resistant to a rush current flowing into the discharge elements Q31 and Q32. Therefore, a width of the protecting resistor 36 is made greater than that of the internal resistor 37, thus reducing a current density.

The gate electrode 5d of the PMOS transistor Q31 is connected to the power supply 32 by a gate potential fixing wiring 40, and the gate electrode 5 of the NMOS transistor Q32 is connected to the ground level 33 by a gate potential fixing wiring 41. The PMOS transistor Q31 and the NMOS transistor Q32 are set into an OFF state, respectively.

The next operation will be described below with reference to FIGS. 31, 34 and 35. A surge generated by static electricity is sent through the signal terminal 30 and is first delayed by the protecting resistor 36 to prevent a great rush current from flowing into the discharge elements Q31 and Q32. The surge propagated through the protecting resistor 36 is then discharged quickly into the power supply 32 or the ground level 33 through the discharge elements Q31 and Q32. The internal resistor 37 does not function to cause the surge to flow in a direction of the internal element but in a direction of the discharge element. The surge propagated through the protecting resistor 36 is applied to a discharge element section. If a positive surge voltage is applied, a junction breaks down between the drain region 7 and the channel formation region 6 of the NMOS transistor Q32 to emit the surge to the ground level 33. At the same time, the PMOS transistor Q31 is forward biased and the surge is emitted to the power supply 32 as well. If a negative surge voltage is applied, a junction breaks down between the drain region 7d and the channel formation region 6d of the PMOS transistor Q31 to emit the surge to the power supply 32 and the NMOS transistor Q32 is forward biased to emit the surge. During normal operation, the PMOS transistor Q31 and the NMOS transistor Q32 are set in the OFF state. Therefore, an normal operation signal applied to the signal terminal 30 is propagated to the internal element 31 through the protecting resistor 36 and the internal resistor 37.

FIG. 36 is a sectional view showing a sectional structure of the diode type input-output protecting circuit shown in FIG. 32. As shown in FIG. 36, a thin silicon film 3 is provided on a silicon substrate 1 with a buried oxide film 2 acting as an insulation layer interposed therebetween. The thin silicon film 3 is divided into two islands 19A and 19B by an interlayer dielectric film 11. An anode region 9B into which a p-type impurity having a concentration of about $10^{17}/cm^3$ is implanted, and a cathode region 10B into which an n-type impurity having a concentration of about $10^{17}/cm^3$ is implanted are provided, respectively. An anode region 9A and a cathode region 10A are provided with the anode region 9B interposed therebetween. An anode region 9C and a cathode region 10C are provided with the cathode region 10B interposed therebetween. A p-type impurity having a concentration of about $10^{20}/cm^3$ is implanted into the anode regions 9A and 9C, and an n-type impurity having a concentration of about $10^{20}/cm^3$ is implanted into the cathode regions 10A and 10C.

Furthermore, an electrode 5 is formed on the anode region 9B and a part of the anode region 9A and the cathode region 10A in the thin silicon film 3 with an oxide film 4 interposed therebetween, and an electrode 5d is formed on the cathode region 10B and a part of the anode region 9C and the cathode region 10C in the thin silicon film 3 with an oxide film 4d interposed therebetween. A diode 39 is formed by the anode regions 9A and 9B and the cathode region 10A. A diode 38 is formed by the anode region 9C and the cathode regions 10B and 10C.

A structure of a diode section is the same as that shown in FIG. 35. The anode regions 9B and 9A and the cathode region 10A are replaced with the channel formation region 6, the source region 8 and the drain region 7, respectively. The cathode region 10B, the anode region 9C and the cathode region 10C are replaced with the channel formation region 6d, the drain region 7d and the source region 8d, respectively. While the electrodes 5 and 5d are used as masks during formation of the anode regions 9A and 9C and the cathode regions 10A and 10C, they do not function as components of the element.

The next operation of the input-output protecting circuit shown in FIGS. 32 and 36 is the same as that of the input-output protecting circuit shown in FIGS. 31 and 35 except that emission is performed with breakdown of a junction of the anode region 9B and the cathode region 10A of the diode 39 and breakdown of a junction of the anode region 9C and the cathode region 10B of the diode 38.

In the SOI structure, a thermal conductivity is poor due to existence of the buried oxide film 2, a temperature rise is great even if the same power as that of a bulk element formed on a bulk substrate is put into the discharge element (the temperature rise being about three times as much as that in the bulk substrate), and secondary breakdown (thermal runaway) is caused so that destruction is easily caused. Furthermore, a current flows ununiformly and concentrates on a part of the elements. Consequently, a rapid temperature rise occurs in the element on which the current concentrates. Thus, only the same element causes the secondary breakdown. As a result, an ESD (Electrostatic discharge) resistance of a whole device is deteriorated.

With the SOI structure, furthermore, quality of the thin silicon film 3 is not so good as that of the bulk substrate. Therefore, quality of the gate oxide film 4 formed on the thin silicon film 3 is easily deteriorated so that the ESD resistance is degraded. The deterioration in the quality of the gate oxide film 4 is particularly remarkable in an active region boundary portion (an isolating end) of the thin silicon film 3 having a height difference from the insulation layer 2.

SUMMARY OF THE INVENTION

A first aspect of the present invention is directed to a semiconductor device having an input-output protecting circuit section corresponding to a signal node connected to a signal terminal, and an internal circuit connected to the signal node, which are formed on a SOI substrate, comprising a power supply node connected to a supply potential, and a reference potential node connected to a reference potential, the input-output protecting circuit section including first and second discharge elements being provided between the power supply node and the signal node and having PN junctions and being reversely biased when a normal operation signal is applied to the signal terminal, the first discharge element being forward biased when a surge voltage having a first polarity is applied to the signal terminal, the second discharge element being forward biased when a surge voltage having a second polarity is applied to the signal terminal, and third and fourth discharge elements being provided between the signal node and the reference potential node and having PN junctions and being reversely biased when the normal operation signal is applied to the signal terminal, respectively, the third discharge element being forward biased when the surge voltage having the first polarity is applied to the signal terminal, the fourth discharge element being forward biased when the surge voltage having the second polarity is applied to the signal terminal.

A second aspect of the present invention is directed to the semiconductor device, wherein the first and third discharge elements include first and third MOS transistors of a first conductivity type, the second and fourth discharge elements include second and fourth MOS transistors of a second conductivity type, the first and third MOS transistors have control electrodes connected to the reference potential node respectively, and the second and fourth MOS transistors have control electrodes connected to the power supply node respectively.

A third aspect of the present invention is directed to the semiconductor device, wherein the first discharge element is a MOS transistor of a first conductivity type and has a control electrode connected to the reference potential node, the second and third discharge elements are diodes, and the fourth discharge element is a MOS transistor of a second conductivity type and has a control electrode connected to the power supply node.

A fourth aspect of the present invention is directed to the semiconductor device, further comprising a first internal resistor inserted between the signal terminal and the signal node, and a second internal resistor inserted between the signal node and the internal circuit.

A fifth aspect of the present invention is directed to a semiconductor device having an input-output protecting circuit section corresponding to a signal node connected to a signal terminal, and an internal circuit connected to the signal node, which are formed on a SOI substrate, comprising a power supply node connected to a supply potential, and a reference potential node connected to a reference potential, the input-output protecting circuit section including a MOS transistor of a predetermined conductivity type having a first electrode regions connected to the signal terminal and a second electrode region connected to a potential fixing node which is one of the power supply node and the reference potential node, a first capacitor inserted between the signal terminal and a gate electrode of the MOS transistor, a second capacitor inserted between the potential fixing node and the gate electrode of the MOS transistor, and a pseudo MOS transistor section which has, as component sections, a pseudo gate electrode, a pseudo gate insulation film, and first, second and third diffusing regions corresponding to the gate electrode of the MOS transistor, a gate insulation film, a channel formation region, one of the first electrode regions and the second electrode region respectively, and does not function as a transistor, wherein the first capacitor includes a capacitor formed by a part of the gate electrode of the MOS transistor and a part of one of the first electrode regions with the gate insulation film interposed therebetween, wherein the second capacitor includes a capacitor in which the pseudo MOS transistor section is formed by using a part of the component sections, and wherein a capacity value of the second capacitor is set greater than that of the first capacitor in such a manner that the MOS transistor is reversely biased when the normal operation signal is applied to the signal terminal, and is forward biased when a surge voltage having a first or second polarity is applied to the signal terminal.

A sixth aspect of the present invention is directed to the semiconductor device, wherein the first and second diffusing regions have the same conductivity type, the second diffusing region is connected to the potential fixing node, and the pseudo gate electrode is connected to the gate electrode of the MOS transistor in the pseudo MOS transistor section, and wherein the second capacitor includes a capacitor formed by the pseudo gate electrode and the first diffusing region with the pseudo gate insulation film interposed therebetween.

A seventh aspect of the present invention is directed to the semiconductor device, wherein the first diffusing region has a conductivity type which is different from that of the second diffusing region, the second and third diffusing regions have the same conductivity type, the third diffusing region is connected to the potential fixing node, and the pseudo gate electrode is connected to the gate electrode of the MOS transistor in the pseudo MOS transistor section, and wherein the second capacitor includes a capacitor formed by the pseudo gate electrode and the first diffusing region with the pseudo gate insulation film interposed therebetween.

An eighth aspect of the present invention is directed to the semiconductor device, wherein the first diffusing region has a conductivity type which is different from that of the second diffusing region, the first and third diffusing regions have the same conductivity type, and the third diffusing region is connected to the potential fixing node, and the second diffusing region is connected to the gate electrode of the MOS transistor in the pseudo MOS transistor section, and wherein the second capacitor includes a capacitor formed by a PN junction of the first diffusing region and the second diffusing region.

A ninth aspect of the present invention is directed to a semiconductor device comprising an input-output protecting circuit section, corresponding to a signal node connected to a signal terminal, formed by using a MOS transistor for input-output protection and an internal circuit section formed by using a MOS transistor for an internal circuit for serving to perform a predetermined signal processing on an inside, which are formed on a SOI substrate, wherein the MOS transistor for input-output protection has a structure in which punch through is caused more easily than in the MOS transistor for an internal circuit.

A tenth aspect of the present invention is directed to the semiconductor device, wherein an impurity concentration of a channel formation region of the MOS transistor for input-output protection is set lower than that of a channel formation region of the MOS transistor for an internal circuit.

An eleventh aspect of the present invention is directed to the semiconductor device, wherein a conductivity type of a channel formation region of the MOS transistor for input-output protection is set identical to that of each of a drain region and a source region thereof, and a conductivity type of a channel formation region of the MOS transistor for an internal circuit is set different from that of each of a drain region and a source region thereof.

A twelfth aspect of the present invention is directed to the semiconductor device, wherein the MOS transistor for input-output protection and the MOS transistor for an internal circuit have the same conductivity type, and a conductivity type of a gate electrode of the MOS transistor for input-output protection is made different from that of a gate electrode of the MOS transistor for an internal circuit to set a threshold voltage of the MOS transistor for input-output protection almost equal to that of the MOS transistor for an internal circuit.

A thirteenth aspect of the present invention is directed to a semiconductor device comprising an input-output protecting circuit section formed on a SOI substrate and having first and second diodes connected to a signal terminal, the input-output protecting circuit section including a first semiconductor region of a first conductivity type, a second semiconductor region of a second conductivity type formed adjacently to the first semiconductor region, a third semiconductor region of the first conductivity type formed independent of the first and second semiconductor regions, a fourth semiconductor region of the second conductivity type formed adjacently to the third semiconductor region, first to fourth silicide regions which are selectively formed on surfaces of the first to fourth semiconductor regions, respectively, an interlayer dielectric film formed by covering the first to fourth semiconductor regions including the first to fourth silicide regions, a first wiring layer connected to a reference potential and formed on the first silicide region through the interlayer dielectric film, a second wiring layer connected to the signal terminal and formed on the second and third silicide regions through the interlayer dielectric film, and a third wiring layer connected to a power supply and formed on the fourth silicide region through the interlayer dielectric film, wherein the first diode is formed by the first and second semiconductor regions, and the second diode is formed by the third and fourth semiconductor regions.

A fourteenth aspect of the present invention is directed to a semiconductor device comprising an input-output protecting circuit section having a MOS transistor for input-output protection formed on an active region provided like an island on a SOI substrate, wherein a gate electrode of the MOS transistor for input-output protection is formed within the active region on a plane.

According to the first aspect of the present invention, the input-output protecting circuit includes the first to fourth discharge elements having PN junctions, each of which is provided between the power supply node or reference potential node and the signal terminal, is reversely biased when the normal operation signal is applied to the signal terminal and is forward biased when the voltage having the first or second polarity is applied to the signal terminal.

Accordingly, when the surge voltage having the first polarity is applied from the signal terminal, the first and third discharge elements in a forward bias state can cause the power supply node and the reference potential node to discharge a high surge voltage respectively. When the surge voltage having the second polarity is applied from the signal terminal, the second and fourth discharge elements in the forward bias state can cause the power supply node and the reference potential node to discharge the surge voltage respectively.

As a result, there are two discharge elements for discharging any surge voltage in the forward bias state into the power supply node and the reference potential node, respectively. Therefore, an input-output protecting circuit having an excellent ESD resistance can be obtained.

All the PN junctions of the first to fourth discharge elements are brought into a reverse bias state when the normal operation signal is applied to the signal terminal. Therefore, the normal operation signal does not leak to the power supply node or the grounding line through the first to fourth discharge elements, and normal operation of the internal circuit is not affected by the input-output protecting circuit.

According to the second aspect of the present invention, the input-output protecting circuit is formed by the first and third MOS transistors of the first conductivity type and the second and fourth MOS transistors of the second conductivity type. Two transistors whose conductivity types are different from each other are used, respectively. Therefore, the input-output protecting circuit can easily be manufactured.

According to the third aspect of the present invention, the input-output protecting circuit is formed by the first transistor of the first conductivity type, the second transistor of the second conductivity type, and the first and second diodes. Consequently, the transistors whose conductivity types are different from each other are used one by one. Therefore, the input-output protecting circuit can easily be manufactured.

According to the fourth aspect of the present invention, the first internal resistor is inserted between the signal terminal and the signal node, and the second internal resistor is inserted between the signal node and the internal circuit. Consequently, if the surge voltage having the first or second polarity is applied to the signal terminal, propagation delay is caused by the first internal resistor and propagation to the internal circuit is prevented by the second internal resistor, thus protecting the internal circuit.

According to the fifth aspect of the present invention, the gate electrode of the MOS transistor of the input-output protecting circuit is connected to the signal terminal and the potential fixing node through the first and second capacitors. The capacity value of the second capacitor is set greater than that of the first capacitor so as to meet the conditions for setting the capacity value in which the MOS transistor is brought into a reverse bias state if the normal operation signal is applied to the signal terminal and it is brought into a forward bias state if the surge voltage having the first or second polarity is applied to the signal terminal.

Accordingly, when the surge voltage having the first or second polarity is applied from the signal terminal, it can be discharged into the potential fixing node by the MOS transistor set in the forward bias state. Consequently, the input-output protecting circuit having an excellent ESD characteristic can be obtained.

According to the sixth aspect of the present invention, the second capacitor of the input-output protecting circuit is formed by the pseudo gate electrode and the first diffusing region with the pseudo gate insulation film of the pseudo MOS transistor interposed therebetween. Consequently, the second capacitor can have the capacity value which is greater than that of the first capacitor formed by a part of the gate electrode and a part of the first electrode regions of the MOS transistor with the gate insulation film interposed therebetween and meets the conditions for setting the capacity value.

According to the seventh aspect of the present invention, the second capacitor of the input-output protecting circuit is formed by the pseudo gate electrode and the first diffusing region with the pseudo gate insulation film of the pseudo MOS transistor interposed therebetween. Consequently, when an inversion phenomenon is generated in the first diffusing region, the second capacitor can have the capacity value which is much greater than that of the first capacitor and meets the conditions for setting the capacity value.

According to the eighth aspect of the present invention, the second capacitor of the input-output protecting circuit is formed by the PN junction of the first diffusing region and the second diffusing region. Consequently, the second capacitor can have the capacity value which is much greater than that of the first capacitor and meets the conditions for setting the capacity value.

According to the ninth aspect of the present invention, the MOS transistor for input-output protection has a structure in which punch through is caused more easily than in the MOS transistor for an internal circuit. Consequently, the surge voltage can be discharged through the MOS transistor for input-output protection which is brought into a punch through phenomenon. Thus, the ESD resistance of the input-output protecting circuit can be enhanced.

According to the tenth aspect of the present invention, the impurity concentration of the channel formation region of the MOS transistor for input-output protection is set lower than that of the channel formation region of the MOS transistor for an internal circuit. Consequently, the MOS transistor for input-output protection can cause the punch through more easily than the MOS transistor for an internal circuit.

According to the eleventh aspect of the present invention, the conductivity type of the channel formation region of the MOS transistor for input-output protection is set identical to that of each of the drain and source regions thereof. Consequently, the MOS transistor for input-output protection can cause the punch through more easily than the MOS transistor for an internal circuit According to the twelfth aspect of the present invention, the conductivity type of the gate electrode of the MOS transistor for input-output protection is made different from that of the gate electrode of the MOS transistor for an internal circuit so that the threshold voltage of the MOS transistor for input-output protection is set almost equal to that of the MOS transistor for an internal circuit. Therefore, the MOS transistor for input-output protection can have a structure in which the punch through is caused more easily than in the MOS transistor for an internal circuit without making a difference in the threshold voltage between the MOS transistor for input-output protection and the MOS transistor for an internal circuit.

According to the thirteenth aspect of the present invention, the input-output protecting circuit is formed by the first diode comprising the first and second semiconductor regions and the second diode comprising the third and fourth semiconductor regions which are provided on the SOI substrate.

A region which causes a deterioration in the ESD resistance is not formed on the periphery of the first to fourth semiconductor regions. Therefore, the input-output protecting circuit having an excellent ESD resistance can be obtained. The first to fourth semiconductor regions are connected to the first to third wiring layers through the first to fourth suicide regions. Consequently, a contact resistance with the first to third wiring layers can be reduced.

According to the fourteenth aspect of the present invention, the gate electrode of the MOS transistor for input-output protection is formed in the active region on a plane. Consequently, the gate electrode is not formed on the end of the active region provided like an island so that the ESD resistance can correspondingly be enhanced.

In order to solve the above-mentioned problems, it is an object of the present invention to provide a semiconductor device having a SOI structure in which an ESD resistance can be enhanced.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Principle

Figure 18:
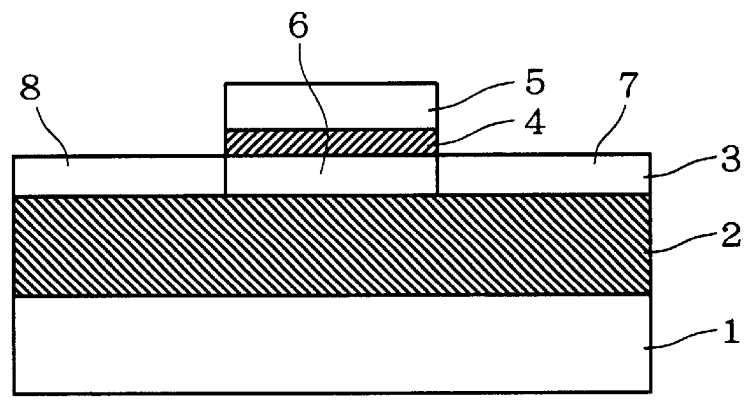
FIG. 18 is a sectional view showing a SOI sectional structure.

FIG. 18 is a sectional view showing a SOI structure. As shown in FIG. 18, a buried oxide film 2 is formed on a silicon substrate 1, and a thin silicon film 3 is formed on the buried oxide film 2. Thus, a structure comprising the silicon substrate 1, the buried oxide film 2 and the thin silicon film 3 is referred to as a SOI substrate. A gate oxide film 4 is selectively formed on the thin silicon film 3. A gate electrode 5 is formed on the gate oxide film 4. The thin silicon film 3 provided under the gate oxide film 4 acts as a channel formation region 6. Regions in the thin silicon film 3 which are adjacent to the channel formation region 6 act as drain and source regions 7 and 8.

With such a SOI structure, the buried oxide film 2 having a poor thermal conductivity (which is about ⅒ as much as that of silicon) is provided as described above. For this reason, heat generated when a surge voltage is applied is stored so that permanent destruction of a semiconductor device formed on the SOI substrate is easily caused by thermal runaway.

Figure 19:
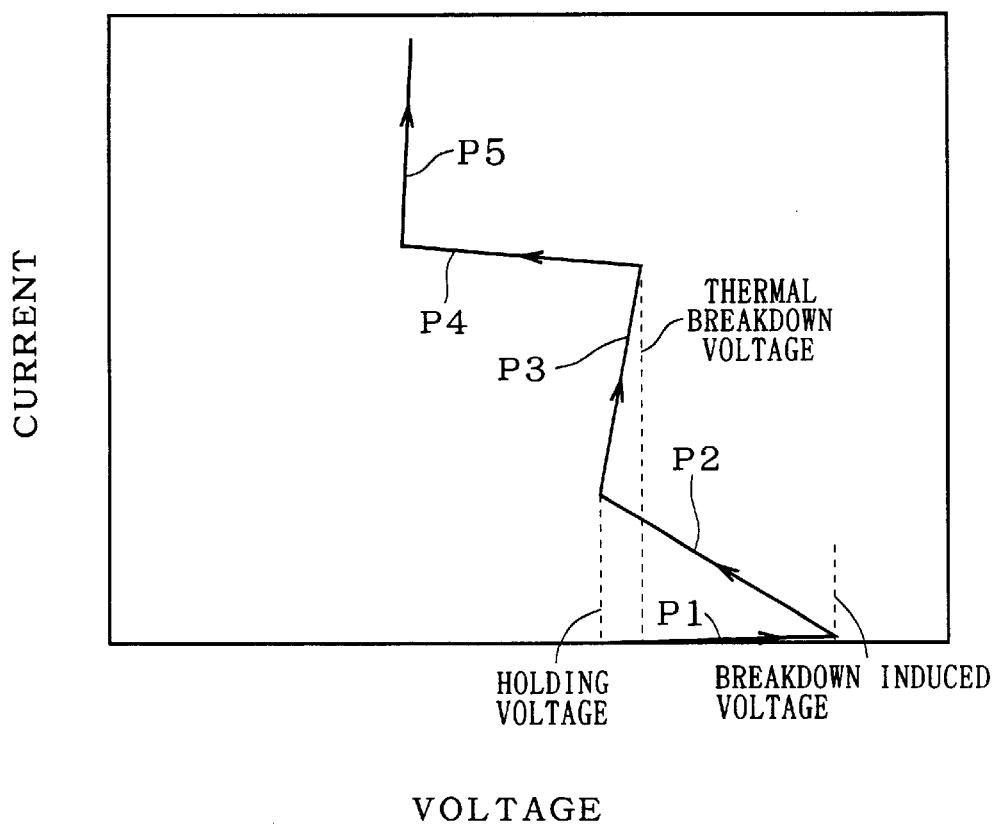
FIG. 19 is a graph showing a discharge characteristic of an NMOS transistor which is reverse bias connected.
Figure 20:
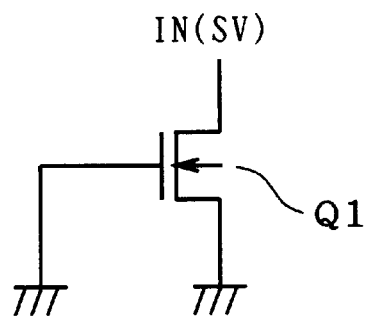
FIG. 20 is a circuit diagram showing the NMOS transistor which is reverse bias connected.

FIG. 19 is a graph showing a discharge characteristic of an NMOS transistor which is obtained at the time of reverse bias connection. The graph of FIG. 19 indicates details of the thermal runaway caused at the time of the reverse bias connection, for example, when an input voltage IN (a surge voltage SV) is applied to a drain of an NMOS transistor Q1 having a source and a gate grounded as shown in FIG. 20. A process of the thermal runaway shown in FIG. 19 includes partial processes P1 to P5.

Figure 21:
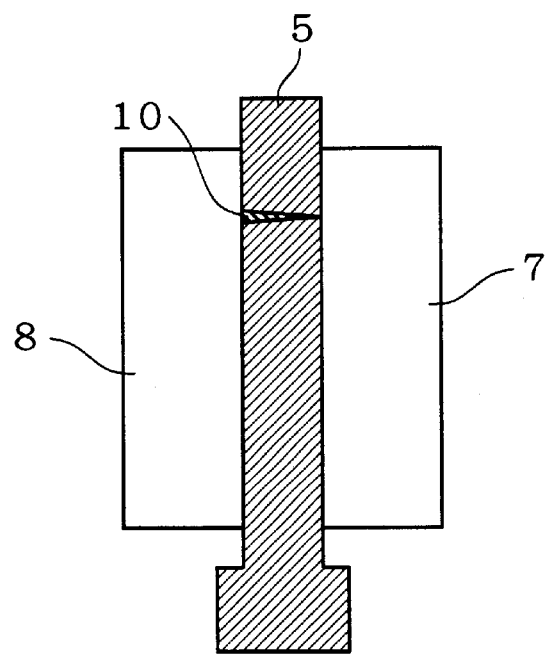
FIG. 21 is a plan view showing a planar structure of a MOS transistor in which thermal runaway destruction occurs.

When a positive surge voltage SV which is much greater than an ordinary voltage is applied to the drain of the NMOS transistor Q1 shown in FIG. 20, a drain voltage is quickly raised (P1). Since the NMOS transistor Q1 is reversely biased during the partial process P1, a current hardly flows. When a breakdown induced voltage is reached, the NMOS transistor Q1 causes avalanche breakdown to perform parasitic bipolar operation. Consequently, the drain voltage is dropped up to a holding voltage (P2). Then, the drain voltage is raised again with an internal resistance of the NMOS transistor Q1 (P3). When a thermal breakdown voltage is reached, a silicon portion forming a part of the NMOS transistor Q1 is brought into a fusing state so that a resistance value between a source and a drain is rapidly reduced so that the voltage is dropped (P4). As a result, a current concentrates on the NMOS transistor Q1 having a resistance reduced between the source and the drain, that is, positive feedback is caused (P5). Consequently, the NMOS transistor Q1 completely breaks down. For example, a large defective portion 11) is generated on the gate electrode 5 (or the channel formation region 6) by thermal breakdown as shown in FIG. 21. Thus, transistor operation cannot be performed.

Figure 22:
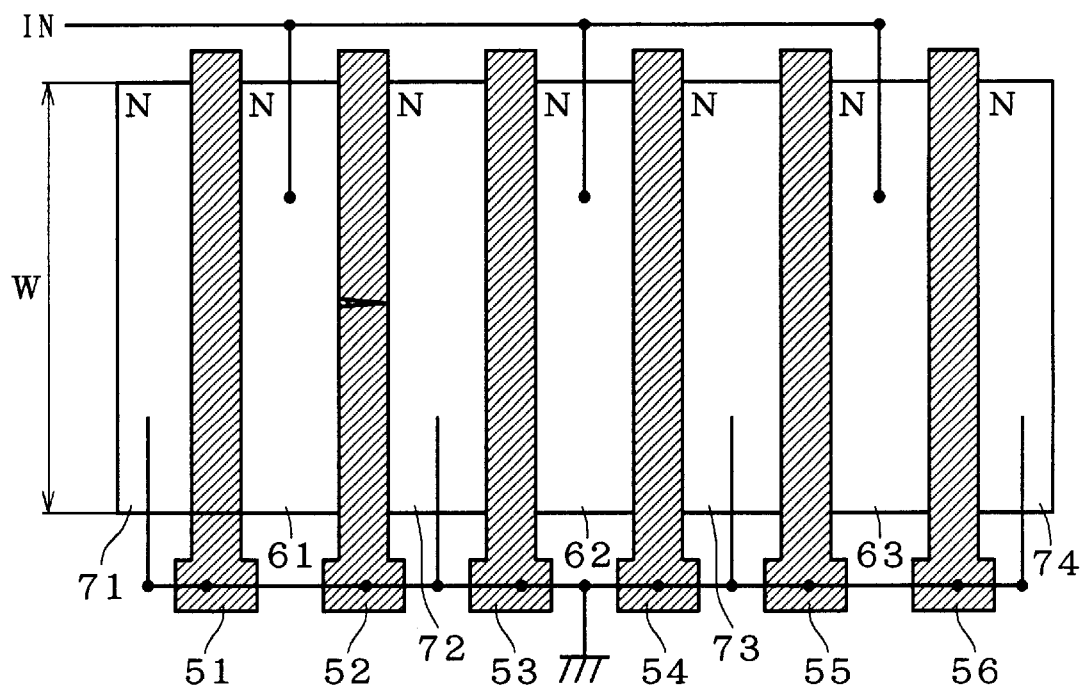
FIG. 22 is a plan view showing a planar structure in which a plurality of NMOS transistors are connected in parallel between an input and a ground.
Figure 23:
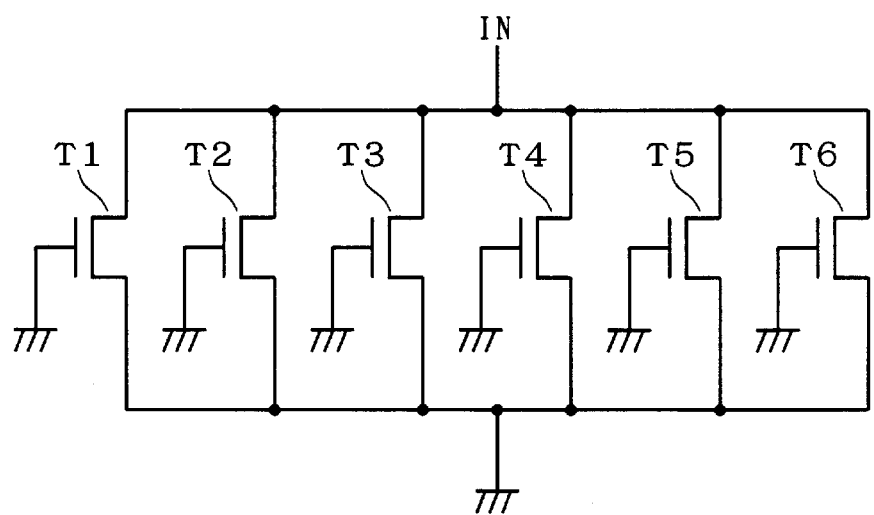
FIG. 23 is a circuit diagram showing a circuit structure in FIG. 22.

In the case where NMOS transistors are usually reversely biased as an input-output protecting circuit on the SOI substrate, NMOS transistors having a channel width W are connected in parallel between an input (voltage) IN and a ground level as shown in FIG. 22. In an example of FIG. 22, six NMOS transistors T1 to T6 having gates grounded are provided in parallel between the input IN and the ground level as shown in FIG. 23. The NMOS transistor T1 is formed by a gate electrode 51, a drain region 61 and a source region 71. The NMOS transistor T2 is formed by a gate electrode 52, the drain region 61 and a source region 72. The NMOS transistor T3 is formed by a gate electrode 53, a drain region 62 and the source region 72. The NMOS transistor T4 is formed by a gate electrode 54, the drain region 62 and a source region 73. The NMOS transistor T5 is formed by a gate electrode 55, a drain region 63 and the source region 73. The NMOS transistor T6 is formed by a gate electrode 56, the drain region 63 and a source region 74. A surge voltage is applied from a signal terminal 30.

Thus, the six NMOS transistors T1 to T6 are provided as the input-output protecting circuit on the SOI substrate in parallel between the input IN and the ground level. Consequently, in the case where a current flows between the input IN and the ground level, it splits and flows into the six NMOS transistors T1 to T6.

However, if one of the NMOS transistors T1 to T6 gets an avalanche breakdown voltage, a resistance between a source and a drain of the same transistor is reduced. Consequently, a current concentrates on the transistor which has caused avalanche breakdown. Thus, it is impossible to prevent the same transistor from getting a thermal breakdown voltage for thermal breakdown.

Figure 24:
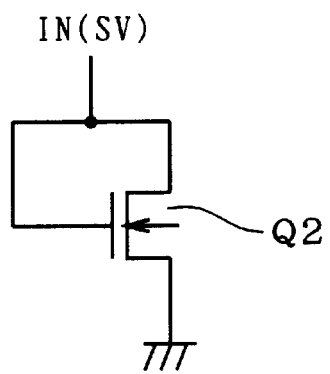
FIG. 24 is a circuit diagram showing an NMOS transistor which is forward bias connected.
Figure 25:
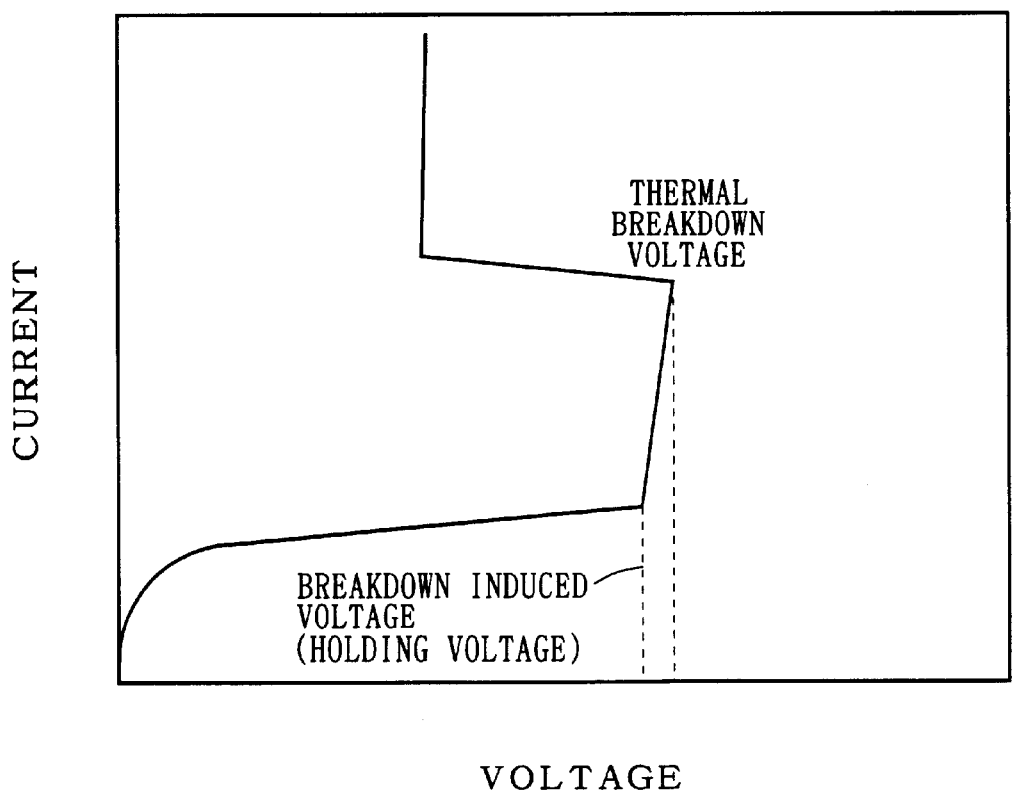
FIG. 25 is a graph showing a discharge characteristic of the NMOS transistor which is forward bias connected.

FIG. 25 is a graph showing a discharge characteristic of an NMOS transistor which is obtained at the time of forward bias connection. The graph of FIG. 25 indicates details of the thermal runaway caused at the time of the forward bias connection, for example, when an input voltage IN (a surge voltage SV) is applied to a drain and a gate of an NMOS transistor Q2 having a source grounded as shown in FIG. 24.

Figure 26:
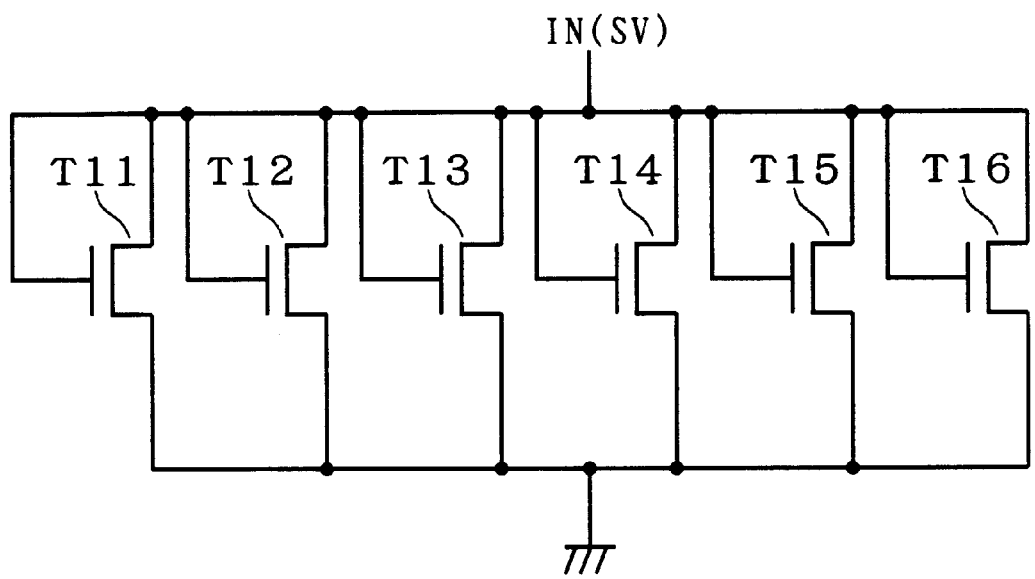
FIG. 26 is a circuit diagram showing a structure in which forward bias connection is performed by using a plurality of NMOS transistors.

FIG. 25 is a graph showing the discharge characteristic of the NMOS transistor which is obtained at the time of the forward bias connection in FIG. 24. As shown in FIG. 25, a snap back phenomenon in which a drain voltage is dropped when a breakdown induced voltage is reached is not caused at the time of the forward bias connection. As shown in FIG. 26, accordingly, a plurality of NMOS transistors T11 to T16 provided in parallel between an input IN and a ground level cause avalanche breakdown almost uniformly with application of the surge voltage SV, and are brought into a thermal runaway state in the same manner as the reverse bias connection when a thermal breakdown voltage is reached by further application of the surge voltage SV.

When a part of the NMOS transistors connected in parallel as shown in FIG. 26 causes the avalanche breakdown, the drain voltage is raised so that the other transistors also cause the avalanche breakdown. As a result, all the transistors cause the avalanche breakdown and a current uniformly flows into all the transistors. Consequently, thermal breakdown is caused at a thermal breakdown voltage which is higher than the breakdown induced voltage.

Thus, a phenomenon in which a current concentrates on a part of the transistors that have caused the avalanche breakdown does not occur at the time of the forward bias connection differently from the time of the reverse bias connection. Consequently, a comparatively excellent ESD resistance can be obtained.

Figure 27:
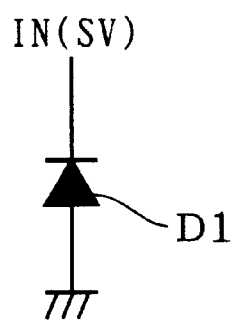
FIG. 27 is a circuit diagram showing a diode which is reverse bias connected.
Figure 28:
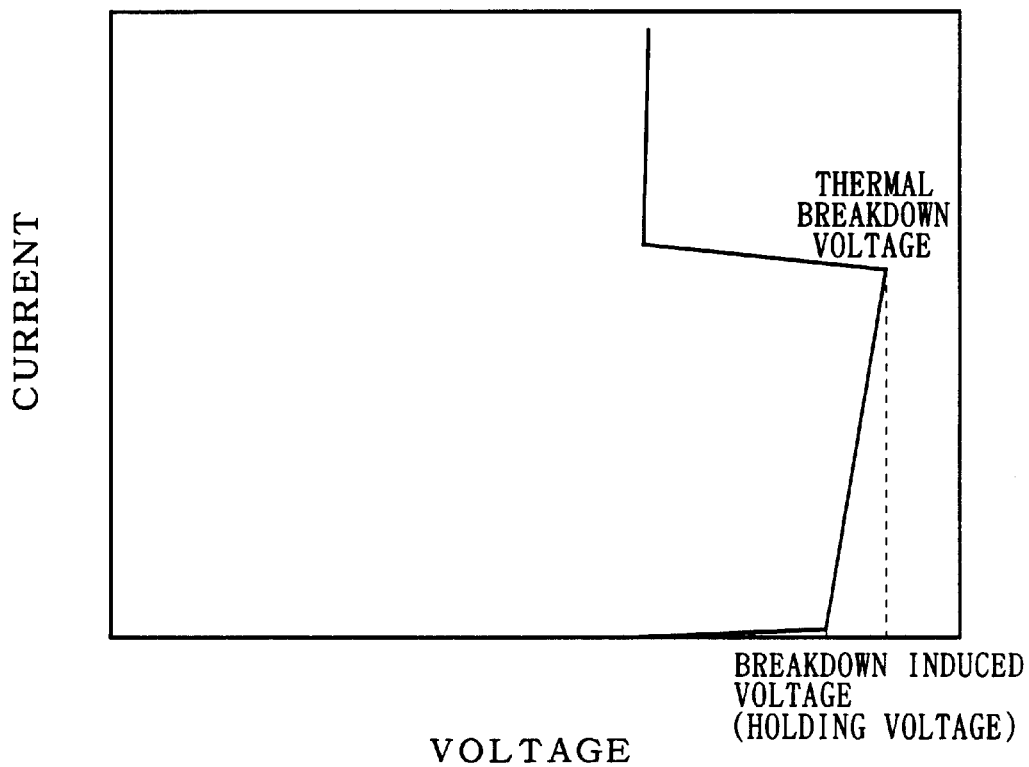
FIG. 28 is a graph showing a discharge characteristic of the diode which is reverse bias connected.

FIG. 28 is a graph showing a discharge characteristic of a diode which is obtained at the time of the reverse bias connection. The graph of FIG. 28 indicates details of thermal runaway obtained at the time of the reverse bias connection, for example, when the surge voltage SV is applied to a cathode of a diode D1 having an anode grounded as shown in FIG. 27.

The diode does not perform parasitic bipolar operation. Therefore, a voltage is successively raised after the avalanche breakdown, resulting in thermal breakdown. A thermal breakdown voltage which is higher than a breakdown induced voltage is effective in prevention of current concentration in the same manner as in the NMOS transistors which are forward bias connected. However, the breakdown induced voltage itself of the diode is high (which is about twice or three times as much as that of the MOS transistor). Therefore, power dissipation represented by a product of a voltage and a current is increased (that is, heat is also increased). As a result, the ESD resistance is deteriorated. If a junction breakdown voltage of the diode is dropped by a high concentration junction or the like, the breakdown induced voltage can be dropped. Consequently, the ESD resistance can be improved.

Figure 29:
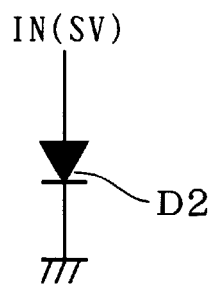
FIG. 29 is a circuit diagram showing a diode which is forward bias connected.
Figure 30:
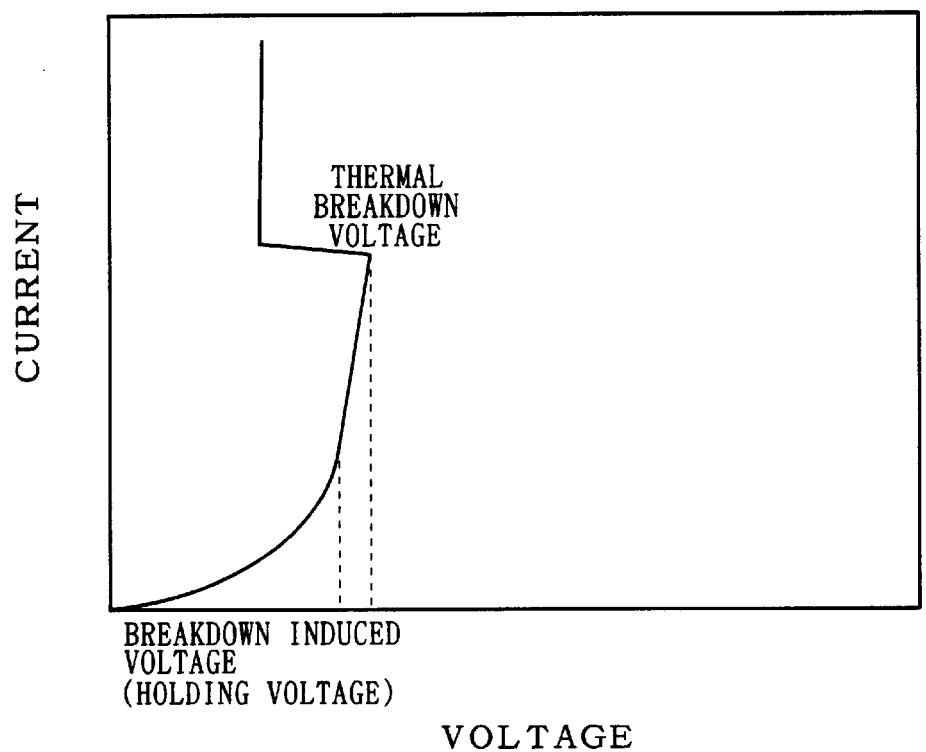
FIG. 30 is a graph showing a discharge characteristic of the diode which is forward bias connected.
Figure 31:
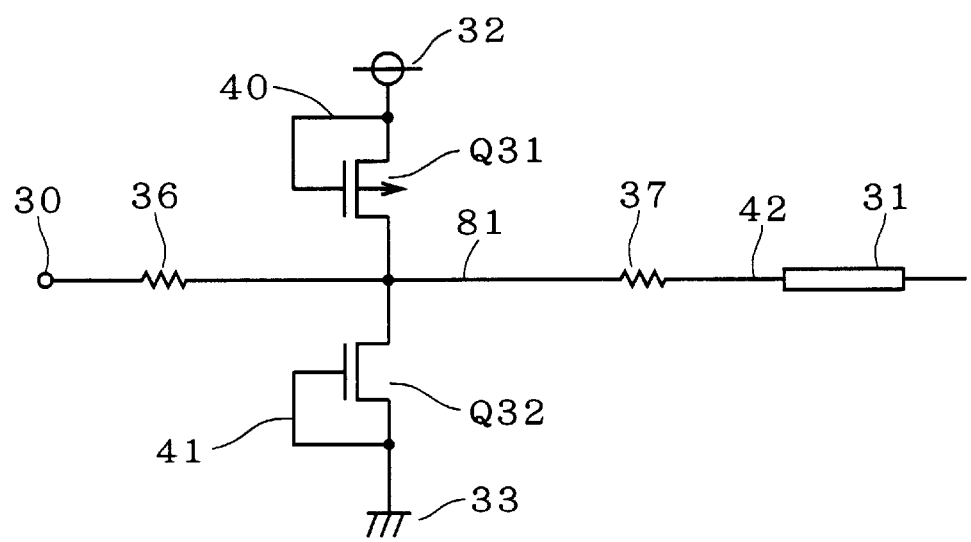
FIG. 31 is a circuit diagram showing a structure of an input-output protecting circuit according to the prior art.

FIG. 30 is a graph showing a discharge characteristic of the diode which is obtained at the time of forward bias connection. The graph of FIG. 30 indicates details of thermal runaway caused at the time of the forward bias connection, for example, when a surge voltage SV is applied to an anode of a diode D2 having a cathode grounded as shown in FIG. 29.

Forward connection of the diode can discharge a great current at a low voltage. Therefore, a desired discharge characteristic for the ESD resistance can be obtained. As shown in FIG. 30, the avalanche breakdown is caused with an increase in a voltage. In the same manner as in other elements, when a thermal breakdown voltage is reached, permanent destruction of the element is caused by the thermal runaway.

As described above, even if any of a transistor and a diode is used, nonuniformity of a current can be prevented more easily and the ESD resistance can be enhanced more when the forward connection is utilized.

Structure and Operation of First Mode

Figure 1:
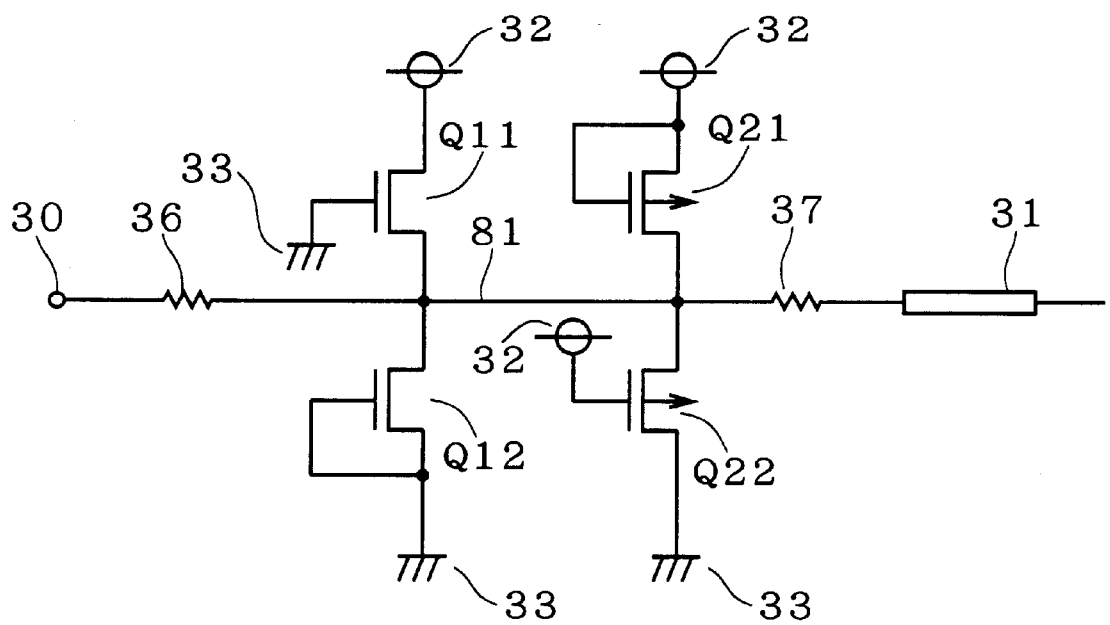
FIG. 1 is a circuit diagram showing a structure of an input-output protecting circuit of a semiconductor device according to a first embodiment of the present invention.

FIG. 1 is a circuit diagram showing a structure of an input-output protecting circuit according to a first mode of a first embodiment of the present invention. As shown in FIG. 1, a signal terminal 30 is connected to one of ends of a protecting resistor 36, the other end of the protecting resistor 36 is connected to one of ends of an internal resistor 37 through a signal line (signal node) 81, and the other end of the internal resistor 37 is connected to an internal element 31.

Between a power supply 32 and a ground level 33, NMOS transistors Q11 and Q12 are connected in series and PMOS transistors Q21 and Q22 are connected in series. The NMOS transistor Q11 has a gate connected to the ground level 33, a drain connected to the power supply 32, and a source connected to the other end of the protecting resistor 36 (one of ends of the internal resistor 37). The NMOS transistor Q12 has a gate and a source connected to the ground level 33, and a drain connected to the source of the NMOS transistor Q11. The PMOS transistor Q21 has a gate and a source connected to the power supply 32, and a drain connected to the other end of the protecting resistor 36. The PMOS transistor Q22 has a gate connected to the power supply 32, a source connected to the other end of the protecting resistor 36, and a drain connected to the ground level 33. The NMOS transistors Q11 and Q12 and the PMOS transistors Q21 and Q22 may be formed by parallel connection of a plurality of MOS transistors as shown in FIGS. 23 and 26.

With such a structure, if a positive surge voltage is applied to the signal terminal 30, a voltage which is greater than a voltage obtained by adding threshold voltages of the PMOS transistors Q21 and Q22 to a supply voltage is applied to the signal terminal 30. Consequently, the surge voltage can be discharged into the power supply 32 and the ground level 33 through the PMOS transistors Q21 and Q22 which are brought into a forward bias state for the signal terminal 30, respectively.

On the other hand, if a negative surge voltage is applied to the signal terminal 30, a voltage which is smaller than a voltage obtained by subtracting threshold voltages of the NMOS transistors Q11 and Q12 from a ground level is applied to the signal terminal 30. Consequently, the surge voltage can be discharged into the power supply 32 and the ground level 33 through the NMOS transistors Q11 and Q12 which are brought into the forward bias state for the signal terminal 30, respectively.

During normal operation, a normal operation signal applied to the signal terminal 30 mainly has a voltage ranging from a ground level to a supply level. Therefore, all the NMOS transistors Q11 and Q12 and the PMOS transistors Q21 and Q22 are reversely biased and brought into an OFF state. The normal operation signal is sent to the internal element 31 through the protecting resistor 36 and the internal resistor 37 without a leakage to the power supply 32 or the ground level 33 through the MOS transistor Q11, Q12, Q21 or Q22. In particular, if the voltage of the normal operation signal is limited to the range from the ground level to the power level, the NMOS transistors Q11 and Q12 and the PMOS transistors Q21 and Q22 are surely turned off.

Thus, even if any of the positive and negative surge voltages is applied to the input-output protecting circuit according to the first mode of the first embodiment, either of the NMOS transistors Q11 and Q12 and the PMOS transistors Q21 and Q22 are always brought into the forward bias state for the surge voltage. Consequently, it is possible to obtain an input-output protecting circuit having an excellent ESD resistance.

The NMOS transistors Q11 and Q12 and the PMOS transistors Q21 and Q22 are connected so as to be brought into a reverse bias state when the normal operation signal is input to the signal terminal 30. Therefore, the normal operation is not affected.

Figure 33:
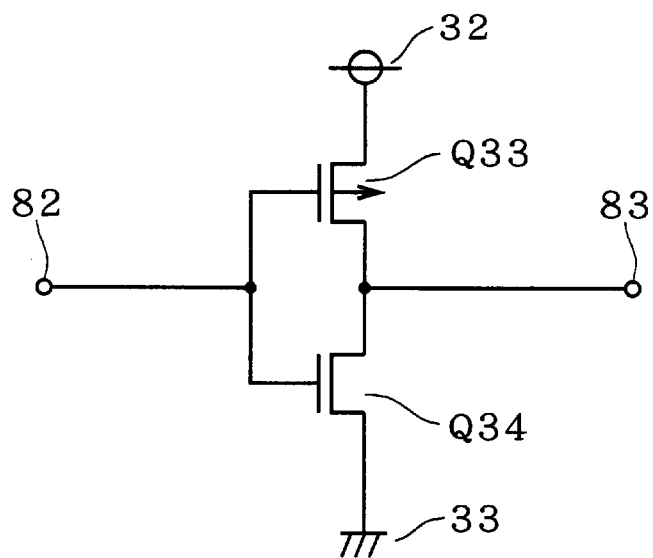
FIG. 33 is a circuit diagram showing an example of an internal element.

The input-output protecting circuit uses two P-channel MOS transistors and two N-channel MOS transistors. As shown in FIG. 33, CMOS inverters including PMOS and NMOS transistors are often formed as the internal element 31. By changing structures of two CMOS inverters a little, the input-output protecting circuit according to the first mode of the first embodiment can easily be manufactured.

Structure and Operation of Second Mode

Figure 2:
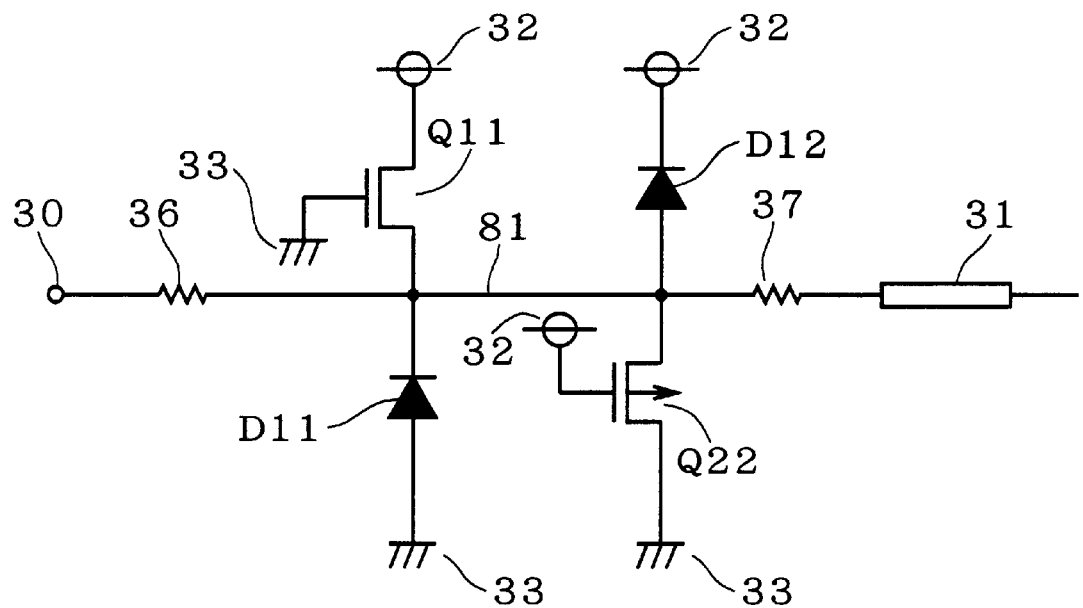
FIG. 2 is a circuit diagram showing another structure of the input-output protecting circuit of the semiconductor device according to the first embodiment of the present invention.

As the second mode, the following structure may be used. More specifically, the NMOS transistor Q12 and the PMOS transistor Q21 are replaced with diodes D11 and D12, a cathode of the diode D11 is connected to the other end of the protecting resistor 36 and an anode of the diode D11 is connected to the ground level 33, and an anode of the diode D12 is connected to the signal line 81 and a cathode of the diode D12 is connected to the power supply 32 as shown in FIG. 2.

In the second mode, when a positive surge voltage is applied to the signal terminal 30, it can be discharged into the power supply 32 and the ground level 33 through the diode D12 and the PMOS transistor Q22 in the forward bias state for the signal terminal 30.

On the other hand, when a negative surge voltage is applied to the signal terminal 30, it can be discharged into the power supply 32 and the ground level 33 through the NMOS transistor Q11 and the diode D11 in the forward bias state for the signal terminal 30.

Thus, if the positive or negative surge voltage is applied to the input-output protecting circuit according to the second mode of the first embodiment, either of the NMOS transistor Q11 and diode D11 and the diode D12 and PMOS transistor Q22 are always brought into the forward bias state for the surge voltage. Consequently, it is possible to obtain an input-output protecting circuit having an excellent ESD resistance.

The NMOS transistor Q11, the diodes D11 and D12 and the PMOS transistor Q22 are connected so as to be always brought into an OFF state when the normal operation signal is input to the signal terminal 30. Therefore, the normal operation is not affected.

According to the second mode, furthermore, MOS transistors of a conductivity type are used one by one with balance kept. Therefore, manufacture can be performed comparatively easily in the same manner as in the first mode.

Second Embodiment

Principle

Figure 3:
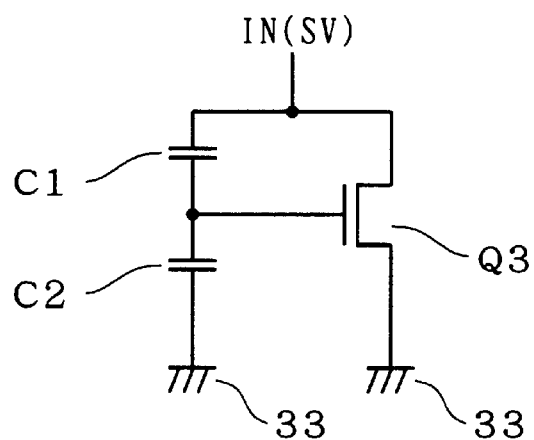
FIG. 3 is a circuit diagram showing an NMOS transistor having a gate coupling sectional structure.

FIG. 3 is a circuit diagram showing a gate coupling structure of a reverse bias of a transistor. As shown in FIG. 3, a gate of an NMOS transistor Q3 which is reverse bias connected for an input signal IN (a surge voltage SV) receives the input signal IN through a capacitor C1, and is connected to a ground level 33 through a capacitor C2. In the gate coupling structure, the gate of the NMOS transistor Q3 is brought into an electrical floating state by the capacitors C1 and C2. For example, such a gate coupling structure has been reported as one of methods enhancing an ESD resistance to IEEE IRPS 1992 p.141.

With such a gate coupling structure, if the input signal IN has an ordinary operating voltage, a rise in a gate potential of the NMOS transistor Q3 is suppressed by coupling of the capacitors C1 and C2. Therefore, the NMOS transistor Q3 is brought into an OFF state.

Figure 4:
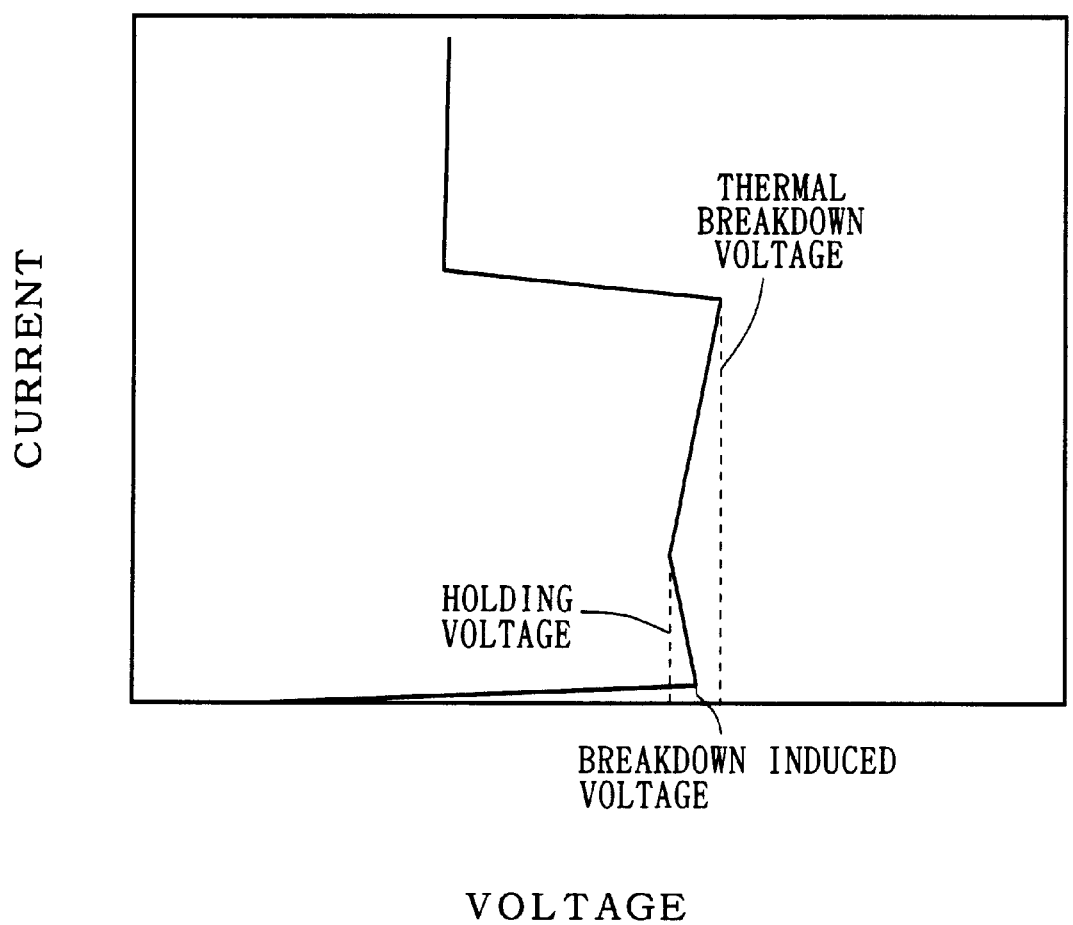
FIG. 4 is a graph showing a discharge characteristic of the NMOS transistor in FIG. 3.

When a positive surge voltage SV is applied, the gate potential of the NMOS transistor Q3 is raised so that a current is caused to flow. Therefore, the NMOS transistor Q3 can approach a forward bias connection state. Consequently, a breakdown induced voltage can be set lower than a thermal breakdown voltage as shown in a graph representing a discharge characteristic in FIG. 4. In the same manner as in forward bias connection, also in the case where a plurality of NMOS transistors Q3 having the gate coupling structure shown in FIG. 3 are connected in parallel between the input signal IN and the ground level 33, a current can be caused to flow uniformly and the ESD resistance can be enhanced. In the second embodiment, such a gate coupling structure is efficiently formed on a SOI substrate.

Structure and Operation of First Mode

Figure 5:
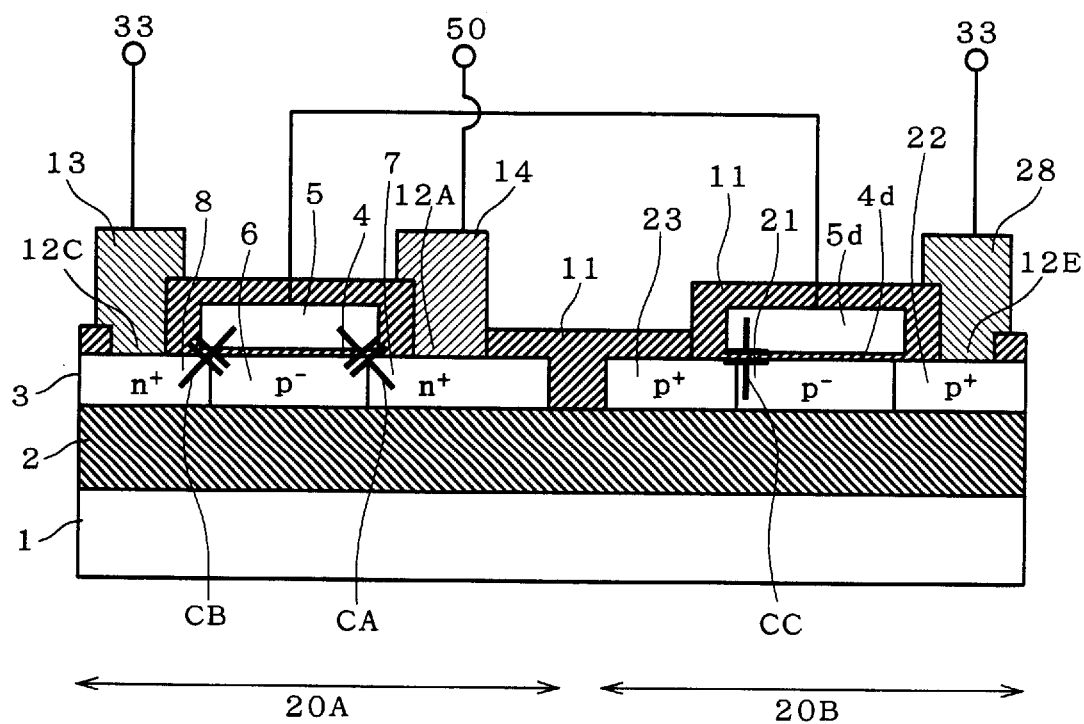
FIG. 5 is a sectional view showing a sectional structure of an input-output protecting circuit of a semiconductor device according to a first mode of a second embodiment of the present invention.

FIG. 5 is a sectional view showing a structure of an input-output protecting circuit according to a first mode of the second embodiment of the present invention. As shown in FIG. 5, a thin silicon film 3 acting as a SOI layer is provided on a silicon substrate 1 with a buried oxide film 2 acting as an insulation layer interposed therebetween. The thin silicon film 3 is divided into two islands 20A and 20B by an interlayer dielectric film 11. In the island 20A, a channel formation region 6 into which a p-type impurity having a concentration of about $10^{17}/cm^3$ is implanted is provided, and drain and source regions 7 and 8 into which an n-type impurity having a concentration of about $10^{20}/cm^3$ is implanted are provided with the channel formation region 6 interposed therebetween. In the island 20B, a p-type diffusing region 21 into which a p-type impurity having a concentration of about $10^{15}$ to $10^{17}/cm^3$ is implanted is provided, and p-type diffusing regions 22 and 23 into which a p-type impurity having a concentration of about $10^{20}/cm^3$ is implanted are provided with the p-type diffusing region 21 interposed therebetween.

Furthermore, a gate electrode 5 is formed on the channel formation region 6 and a part of the drain and source regions 7 and 8 in the thin silicon film 3 of the island 20A with a gate oxide film 4 interposed therebetween. On the other hand, a gate electrode 5d is formed on the p-type diffusing region 21 and a part of the p-type diffusing regions 22 and 23 in the thin silicon film 3 of the island 20B with a gate oxide film 4d interposed therebetween.

Figure 34:
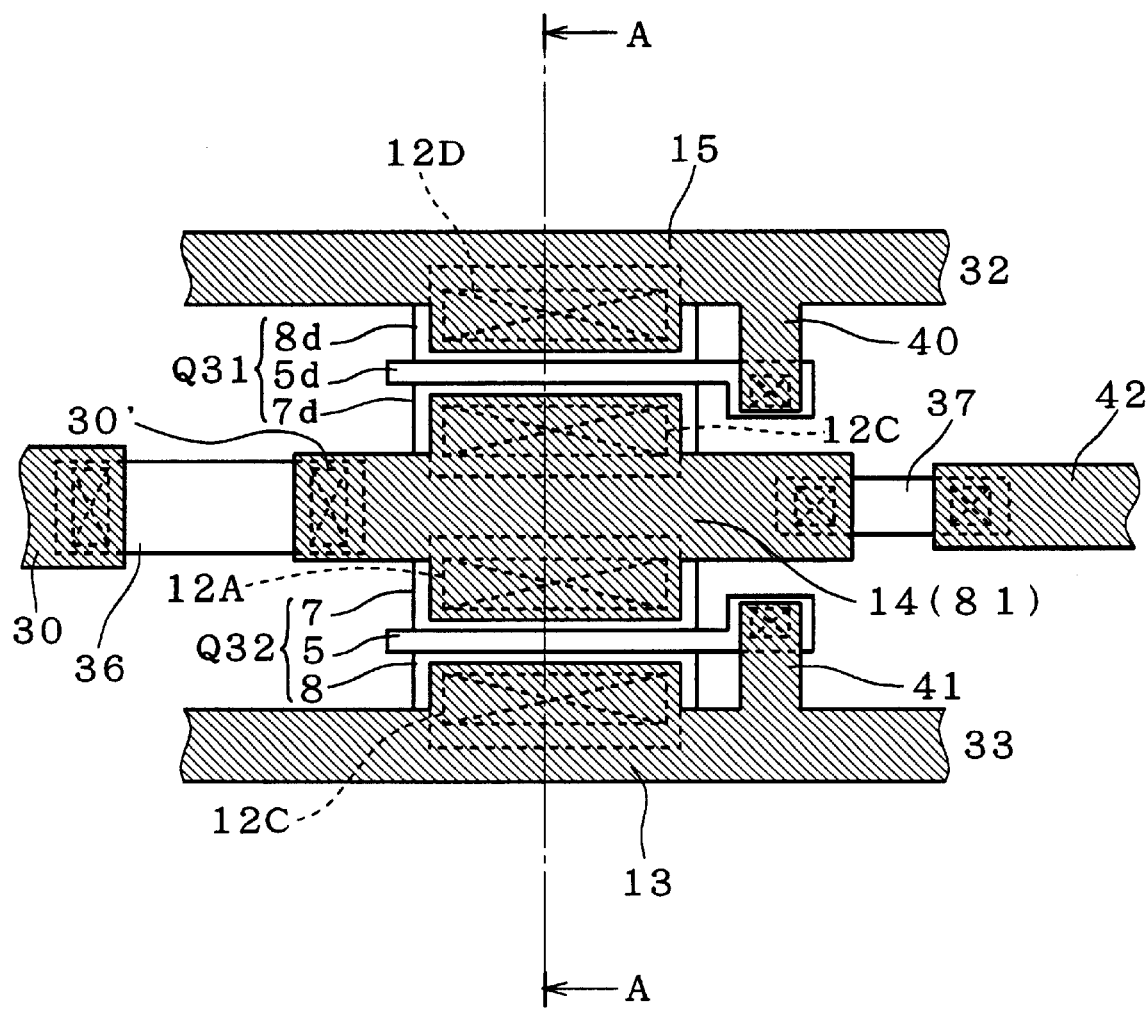
FIG. 34 is a plan view showing a planar structure of a part of the input-output protecting circuit in FIG. 31.
Figure 35:
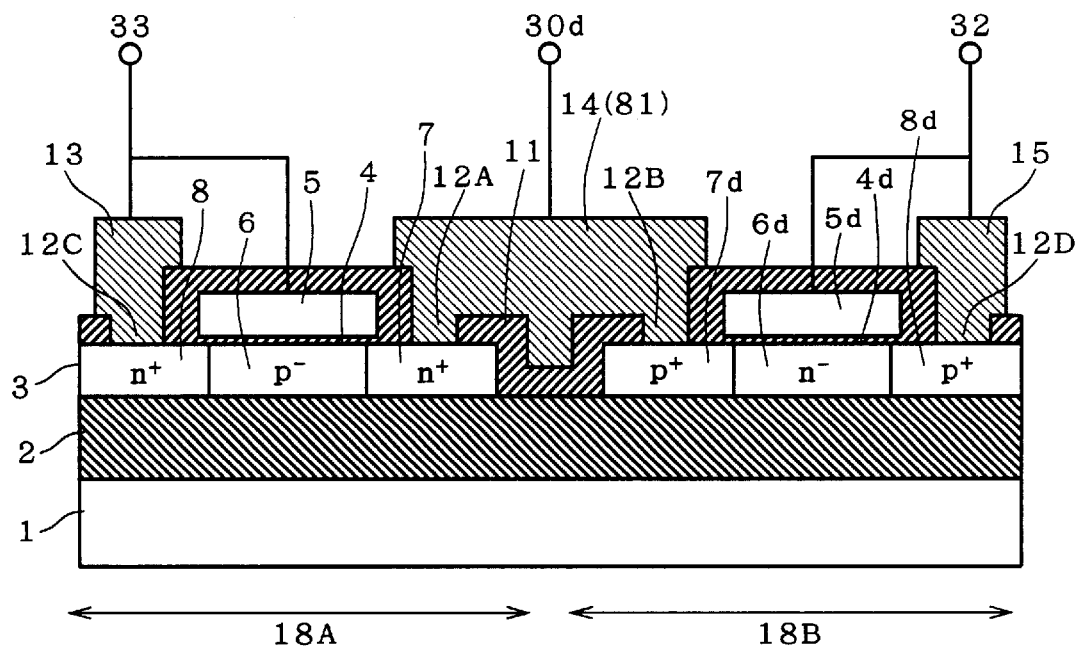
FIG. 35 is a sectional view showing a sectional structure of the part of the input-output protecting circuit in FIG. 31.

In addition, the interlayer dielectric film 11 divides the thin silicon film 3 into the islands 20A and 20B and is formed over the whole surface of the thin silicon film 3. Contact holes 12A, 12C and 12E are provided on the interlayer dielectric film 11 in a part of each of the drain region 7, the source region 8 and the p-type diffusing region 22. An aluminum wiring 14 is electrically connected to the drain region 7 through the contact hole 12A, an aluminum wiring 13 is electrically connected to the source region 8 through the contact hole 12C, and an aluminum wiring 28 is electrically connected to the p-type diffusing region 22 through the contact hole 12E. The aluminum wiring 13 is connected to a ground level 33, the aluminum wiring 14 is connected to an input terminal 50, and the aluminum wiring 28 is connected to the ground level 33. The input terminal 50 may receive an input signal IN through a protecting resistor in the same manner as in FIG. 34 or may directly receive the input signal IN.

Accordingly, the island 20A has an NMOS transistor Q3 formed by the gate oxide film 4, the gate electrode 5, the channel formation region 6, the drain region 7 and the source region 8, and has a (gate overlap) capacitor CA formed by a part of the gate electrode 5 and a part of the drain region 7 which overlap each other on a plane with the gate oxide film 4 interposed therebetween and a (gate overlap) capacitor CB formed by a part of the gate electrode 5 and a part of the source region 8 which overlap each other on a plane with the gate oxide film 4 interposed therebetween.

In the island 20B, a pseudo MOS transistor structure which is similar to a structure of the NMOS transistor Q3 can be obtained by the gate oxide film 4d, the gate electrode 5d and the p-type diffusing regions 21 to 23. A capacitor CC is formed by the gate electrode 5d subordinated on a plane and a part of the p-type diffusing region 21 and p-type diffusing regions 22 and 23 with the gate oxide film 4d interposed therebetween. The capacitor CA corresponds to the capacitor C1 shown in FIG. 3. A composite capacity of the capacitors CB and CC is equivalent to a capacity of the capacitor C2.

Thus, the input-output protecting circuit according to the first mode of the second embodiment forms a MOS transistor having a gate coupling structure on the SOI substrate. With such a structure, when the input signal IN is applied from the input terminal 50, an electric potential of a floating region is raised by the capacitor CA. A capacity of the capacitor CA is smaller than the composite capacity of the capacitors CB and CC. Therefore, a gate potential which is reduced more than a drain potential of the NMOS transistor Q3 is given. Accordingly, if the input signal IN has an operating voltage (which usually ranges from the ground level to the power supply level and in the vicinity thereof), the gate potential is smaller than a threshold voltage of the NMOS transistor Q3 so that the NMOS transistor Q3 is brought into an OFF state. If the input signal IN has a positive high voltage, the gate potential is raised to be greater than the threshold voltage of the NMOS transistor Q3 so that the NMOS transistor Q3 is brought into an ON state. In other words, the NMOS transistor Q3 is brought into a forward bias connection state for the input signal IN.

Thus, the input-output protecting circuit according to the first mode of the second embodiment can effectively drop a breakdown induced voltage to enhance an ESD resistance.

Structure and Operation of Second Mode

Figure 6:
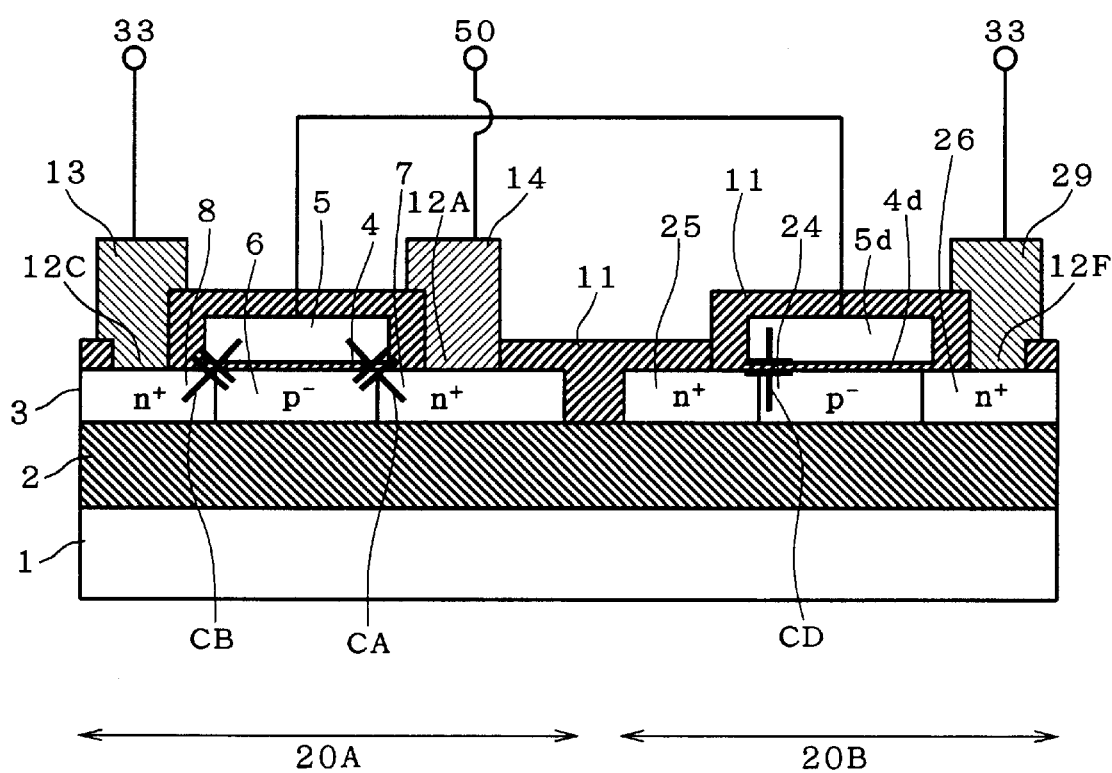
FIG. 6 is a sectional view showing a sectional structure according to a second mode of the second embodiment.

FIG. 6 is a sectional view showing a structure of an input-output protecting circuit according to a second mode of the second embodiment of the present invention. As shown in FIG. 6, a thin silicon film 3 acting as a SOI layer is provided on a silicon substrate 1 with a buried oxide film 2 acting as an insulation layer interposed therebetween. The thin silicon film 3 is divided into two islands 20A and 20B by an interlayer dielectric film 11. A structure of the island 20A is the same as in the first mode shown in FIG. 5.

In the island 20B, a channel formation region 24 into which a p-type impurity having a concentration of about $10^{16}/cm^3$ is implanted is provided, and drain and source regions 25 and 26 into which a p-type impurity having a concentration of about $10^{20}/cm^3$ is implanted are provided with the channel formation region 24 interposed therebetween. Furthermore, a gate electrode 5d is formed on the channel formation region 24 and a part of the drain and source regions 25 and 26 in the thin silicon film 3 of the island 20B with a gate oxide film 4d interposed therebetween.

In addition, the interlayer dielectric film 11 divides the thin silicon film 3 into the islands 20A and 20B and is formed over the whole surface of the thin silicon film 3. Contact holes 12A, 12C and 12F are provided on the interlayer dielectric film 11 in a part of each of a drain region 7, a source region 8 and the source region 26. An aluminum wiring, 14 is electrically connected to the drain region 7 through the contact hole 12A, an aluminum wiring 13 is electrically connected to the source region 8 through the contact hole 12C, and an aluminum wiring 29 is electrically connected to the source region 26 through the contact hole 12F. The aluminum wiring 13 is connected to a ground level 33, the aluminum wiring 14 is connected to an input terminal 50, and the aluminum wiring 29 is connected to the ground level 33.

Accordingly, the island 20A has an NMOS transistor Q3 formed by a gate oxide film 4, a gate electrode 5, a channel formation region 6, the drain region 7 and the source region 8, and has a capacitor CA formed by a part of the gate electrode 5 and a part of the drain region 7 with the gate oxide film 4 interposed therebetween and a capacitor CB formed by a part of the gate electrode 5 and a part of the source region 8 with the gate oxide film 4 interposed therebetween.

In the island 20B, a pseudo NMOS transistor structure which is similar to a structure of the NMOS transistor Q3 can be obtained by the gate oxide film 4d, the gate electrode 5d and the p-type diffusing regions 24, 25 and 26. A capacitor CD is formed by a part of the gate electrode 5d and a part of the drain and source regions 25 and 26 with the gate oxide film 4d interposed therebetween. The capacitor CA corresponds to the capacitor C1 shown in FIG. 3. A composite capacity of the capacitors CB and CD is equivalent to a capacity of the capacitor C2.

The capacitor CD functions only after a voltage at which the channel formation region 24 is almost inverted is applied to the gate electrode 5d. The channel formation region 24 has a concentration of about $10^{16}/cm^3$. Therefore, the channel formation region 24 is inverted even if a comparatively low voltage is applied to the gate electrode 5d.

Thus, the input-output protecting circuit according to the second mode of the second embodiment forms a MOS transistor having a gate coupling structure on a SOI substrate. In the same manner as in the first mode, therefore, the MOS transistor is brought into a reverse bias connection state if an input signal IN is a normal operation signal, and it is brought into a forward bias connection state if the input signal IN has a positive high voltage. Consequently, the same effects as in the first mode can be obtained.

Structure and Operation of Third Mode

Figure 7:
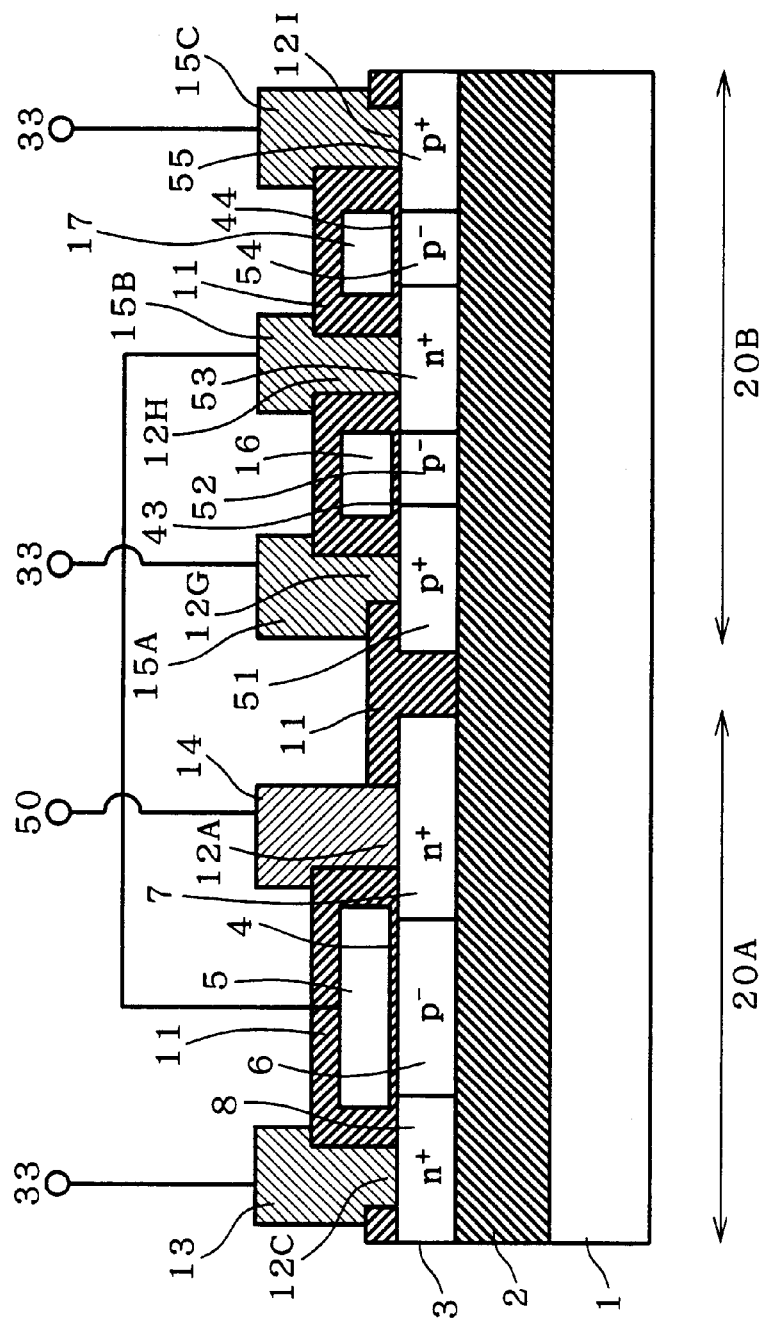
FIG. 7 is a sectional view showing a sectional structure according to a third mode of the second embodiment.

FIG. 7 is a sectional view showing a structure of an input-output protecting circuit according to a third mode of the second embodiment of the present invention. As shown in FIG. 7, a thin silicon film 3 is provided on a silicon substrate 1 with a buried oxide film 2 acting as an insulation layer interposed therebetween. The thin silicon film 3 is divided into two islands 20A and 20B by an interlayer dielectric film 11. A structure of the island 20A is the same as in the first mode shown in FIG. 5.

In the island 20B, p-type diffusing regions 52 and 54 into which a p-type impurity having a concentration of about $10^{15}$ to $10^{17}/cm^3$ is implanted are provided, a p-type diffusing region 51 and an n-type diffusing region 53 into which p- and n-type impurities having a concentration of about $10^{20}/cm^3$ are implanted are provided with the channel formation region 52 interposed therebetween, and the n-type diffusing region 53 and a p-type diffusing region 55 into which n- and p-type impurities having a concentration of about $10^{20}/cm^3$ are implanted are provided with the p-type diffusing region 54 interposed therebetween. Accordingly, the n-type diffusing region 53 is formed between the p-type diffusing regions 52 and 54. Furthermore, gate electrodes 16 and 17 are formed on the p-type diffusing regions 52 and 54 in the thin silicon film 3 of the island 20B with gate oxide films 43 and 44 interposed therebetween.

In addition, the interlayer dielectric film 11 divides the thin silicon film 3 into the islands 20A and 20B and is formed over the whole surface of the thin silicon film 3. Contact holes 12A, 12C, 12G, 12H and 12I are provided on the interlayer dielectric film 11 in a part of each of a drain region 7, a source region 8, the p-type diffusing region 51, the n-type diffusing region 53 and the p-type diffusing region 55. An aluminum wiring 14 is electrically connected to the drain region 7 through the contact hole 12A, an aluminum wiring 13 is electrically connected to the source region 8 through the contact hole 12C, an aluminum wiring 15A is electrically connected to the p-type diffusing region 51 through the contact hole 12G, an aluminum wiring 15B is electrically connected to the n-type diffusing region 53 through the contact hole 12H, and an aluminum wiring 15C is electrically connected to the p-type diffusing region 55 through the contact hole 12I. The aluminum wiring 13 is connected to a ground level 33, the aluminum wiring 14 is connected to an input terminal 50, the aluminum wirings 15A and 15C are connected to the ground level 33, and the aluminum wiring 15B is connected to a gate electrode 5 of the island 20A.

Accordingly, the island 20A has an NMOS transistor Q3 formed by a gate oxide film 4, the gate electrode 5, a channel formation region 6, the drain region 7 and the source region 8, and has a capacitor corresponding to a capacitor CA formed by a part of the gate electrode 5 and a part of the drain region 7 with the gate oxide film 4 interposed therebetween and a capacitor corresponding to a capacitor CB formed by a part of the gate electrode 5 and a part of the source region 8 with the gate oxide film 4 interposed therebetween in the same manner as in the first and second modes.

In the island 20B, a first pseudo MOS transistor structure which is similar to a structure of the NMOS transistor Q3 can be obtained by the gate oxide film 43, the gate electrode 16, the p-type diffusing regions 51 and 52, and the n-type diffusing region 53, and a second pseudo MOS transistor structure which is similar to the structure of the NMOS transistor Q3 can be obtained by the gate oxide film 44, the gate electrode 17, the p-type diffusing regions 54 and 55, and the n-type diffusing region 53.

A capacitor CE (not shown) which has a composite capacity obtained by junction capacities of the p-type diffusing region 52 and the n-type diffusing region 53, and the n-type diffusing region 53 and the p-type diffusing region 54 is formed in the island 20B. The capacitor CA corresponds to the capacitor C1 shown in FIG. 3. A composite capacity of the capacitors CB and CE is equivalent to a capacity of the capacitor C2.

Thus, the input-output protecting circuit according to the third mode of the second embodiment forms a MOS transistor having a gate coupling structure on a SOI substrate. In the same manner as in the first and second modes, the MOS transistor is brought into a reverse bias connection state if an input signal IN is a normal operation signal, and it is brought into a forward bias connection state if the input signal IN has a positive high voltage. Consequently, the same effects as in the first mode can be obtained.

In addition, the third mode also has the following effect. If the gate electrode 5 of the MOS transistor Q3 is set in a floating state as in the first and second modes, an initial voltage becomes unstable. In the third mode, however, the capacitor CE having the junction capacity is used between the gate electrode 5 and the ground level 33. Therefore, the gate electrode 5 of the NMOS transistor Q3 can be fixed to the ground level 33 having a reference potential by a small current flowing in a junction. In the third mode, accordingly, the gate electrode 5 of the NMOS transistor Q3 can be fixed to the ground level without the initial voltage becoming unstable during normal operation, and a gate potential can efficiently be raised only when a surge voltage is applied.

Third Embodiment

Principle

In order to enhance an ESD resistance of a MOS transistor, there has been a method for dropping a punch through voltage more than a breakdown induced voltage with a structure in which punch through is easily caused. In the case where a MOS transistor having such a structure is reverse bias connected to an input terminal as shown in FIG. 20, the MOS transistor early breaks down by a punch through phenomenon when the punch through voltage having a surge set low at the time of application is reached. Consequently, the same discharge phenomenon as that of the forward connection of the diode shown in FIG. 30 is caused so that the ESD resistance is enhanced.

However, a reduction in the punch through voltage is not desirable in respect of actual operation because a performance characteristic of the MOS transistor is deteriorated. A third embodiment takes the above-mentioned technological background into consideration.

Structure and Operation of First Mode

Figure 8:
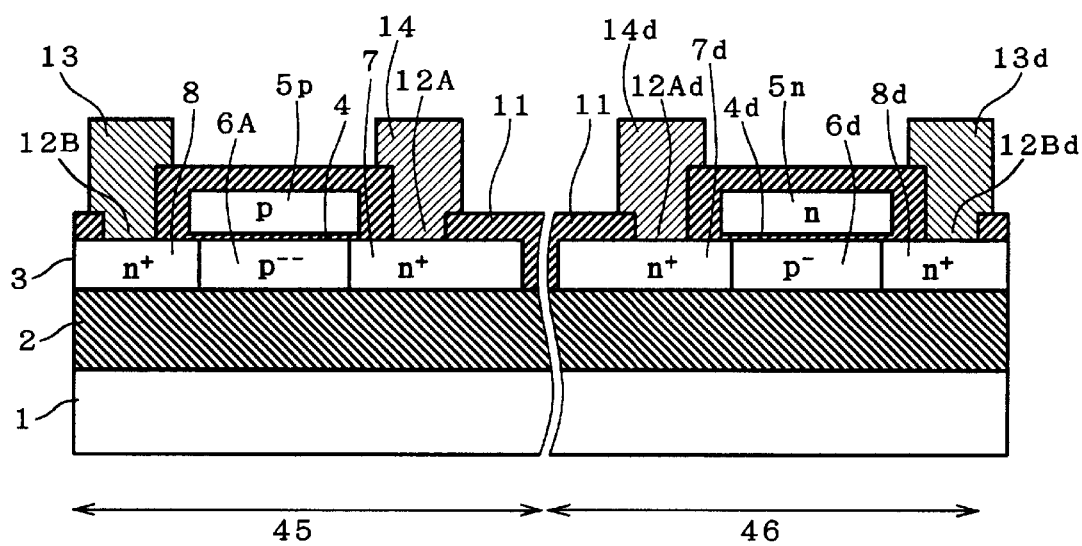
FIG. 8 is a sectional view showing a sectional structure of an input-output protecting circuit of a semiconductor device according to a first mode of a third embodiment of the present invention.

FIG. 8 is a sectional view showing a MOS transistor structure on a SOI substrate which is formed in an input-output protecting circuit section and an internal circuit section of a semiconductor device according to a first mode of the third embodiment of the present invention, respectively. As shown in FIG. 8, a thin silicon film 3 acting as a SOI layer is provided on a silicon substrate 1 with a buried oxide film 2 acting as an insulation layer interposed therebetween. The thin silicon film 3 is divided into an input-output protecting circuit section 45 and an internal circuit section 46 by an interlayer dielectric film 11 or the like. In the input-output protecting circuit section 45, a channel formation region 6A into which a p-type impurity having a concentration of $10^{16}/cm^3$ is implanted is formed, and drain and source regions 7 and 8 into which an n-type impurity having a concentration of about $10^{20}/cm^3$ is implanted are formed with the channel formation region 6A interposed therebetween. In the internal circuit section 46, a channel formation region 6d into which a p-type impurity having a concentration of about $10^{17}/cm^3$ is implanted is formed, and drain and source regions 7d and 8d into which an n-type impurity having a concentration of about $10^{20}/cm^3$ is implanted are provided with the channel formation region 6d interposed therebetween.

Furthermore, a gate electrode 5p is formed on the channel formation region 6A and a part of the drain and source regions 7 and 8 in the thin silicon film 3 of the input-output protecting circuit section 45 with a gate oxide film 4 interposed therebetween. A gate electrode 5n is formed on the channel formation region 6d and a part of the drain and source regions 7d and 8d in the thin silicon film 3 of the internal circuit section 46 with a gate oxide film 4d interposed therebetween. The gate electrode 5p is formed by using p-type polysilicon. The gate electrode 5n is formed by using n-type polysilicon.

In addition, the interlayer dielectric film 11 divides the thin silicon film 3 into the input-output protecting circuit section 45 and the internal circuit section 46, and is formed over the whole surface of the thin silicon film 3. Contact holes 12A, 12Ad, 12B and 12Bd are provided on the interlayer dielectric film 11 in a part of each of the drain regions 7 and 7d and the source regions 8 and 8d, respectively. Aluminum wirings 14 and 14d are electrically connected to the drain regions 7 and 7d through the contact holes 12A and 12Ad, respectively. Aluminum wirings 13 and 13d are electrically connected to the source regions 8 and 8d through the contact holes 12B and 12Bd, respectively.

Accordingly, the input-output protecting circuit section 45 has an NMOS transistor (an NMOS transistor for input-output protection) formed by the gate oxide film 4, the gate electrode 5p, the channel formation region 6A, the drain region 7 and the source region 8, and the internal circuit section 46 has an NMOS transistor (an NMOS transistor for an internal circuit) formed by the gate oxide film 4d, the gate electrode 5n, the channel formation region 6d, the drain region 7d and the source region 8d.

The channel formation region 6A has an impurity concentration which is set lower than that of the channel formation region 6d. Therefore, a punch through voltage is dropped. On the other hand, if an impurity concentration of the channel formation region 6A is low, a threshold voltage is dropped. In order to compensate for the drop in the threshold voltage, p-type polysilicon having the property that a threshold is higher than that of n-type polysilicon is used for the gate electrode 5p. By regulating the impurity concentration of the channel formation region 6A and that of the gate electrode 5n, a threshold voltage which is almost equal to that of the NMOS transistor formed in the internal circuit section 46 can be set.

Thus, the NMOS transistor formed in the input-output protecting circuit section 45 according to the first mode of the third embodiment drops the punch through voltage while keeping the threshold voltage which is almost equal to that of the NMOS transistor formed in the internal circuit section 46. Therefore, it is possible to obtain an input-output protecting circuit having a high ESD resistance. The NMOS transistor formed in the internal circuit section 46 does not drop the punch through voltage. Therefore, a performance characteristic is not deteriorated due to a drop in the punch through voltage.

Structure and Operation of Second Mode

Figure 9:
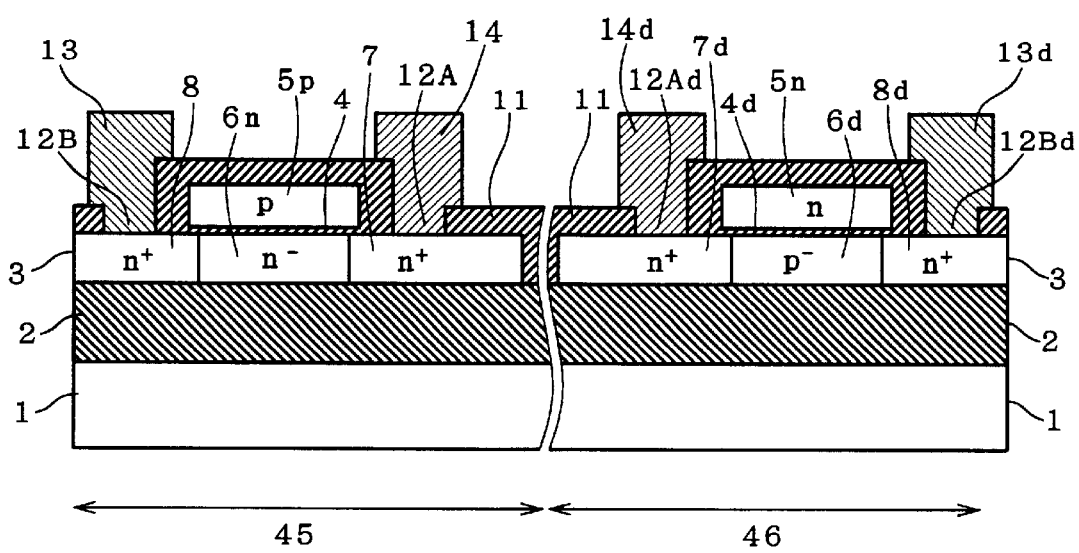
FIG. 9 is a sectional view showing a sectional structure according to a second mode of the third embodiment.

FIG. 9 is a sectional view showing a MOS transistor structure on a SOI substrate which is formed in an input-output protecting circuit section and an internal circuit section of a semiconductor device according to a second mode of the third embodiment of the present invention. As shown in FIG. 9, a thin silicon film 3 acting as a SOI layer is provided on a silicon substrate 1 with a buried oxide film 2 acting as an insulation layer interposed therebetween. The thin silicon film 3 is divided into an input-output protecting circuit section 45 and an internal circuit section 46 by an interlayer dielectric film 11 or the like. In the input-output protecting circuit section 45, a channel formation region 6n into which an n-type impurity having a concentration of about $10^{17}/cm^3$ is implanted is formed, and drain and source regions 7 and 8 into which an n-type impurity having a concentration of about $10^{20}/cm^3$ is implanted are formed with the channel formation region 6n interposed therebetween.

Furthermore, a gate electrode 5p comprising p-type polysilicon is formed on the channel formation region 6n and a part of the drain and source regions 7 and 8 in the thin silicon film 3 of the input-output protecting circuit section 45 with a gate oxide film 4 interposed therebetween. The other structures are the same as in the first mode shown in FIG. 8.

Accordingly, the input-output protecting circuit section 45 has an NMOS transistor formed by the gate oxide film 4, the gate electrode 5p, the channel formation region 6n, the drain region 7 and the source region 8, and the internal circuit section 46 has an NMOS transistor formed by the gate oxide film 4d, a gate electrode 5n, a channel formation region 6d, a drain region 7d and a source region 8d.

The channel formation region 6n of the NMOS transistor formed in the input-output protecting circuit section 45 is formed in accumulation mode of the same conductivity type as that of each of the drain and source regions 7 and 8. Therefore, the punch through voltage is dropped. On the other hand, the threshold voltage is dropped in the accumulation mode. Therefore, p-type polysilicon having the property that a threshold is higher than that of n-type polysilicon is used for the gate electrode 5n to compensate for the drop in the threshold voltage in the same manner as in the first mode. Consequently, a threshold voltage which is almost equal to that of the NMOS transistor formed in the internal circuit section 46 is set. Accordingly, in the case where the NMOS transistor of the input-output protecting circuit section 45 is reverse bias connected, it can be prevented from being turned on in error even if a gate potential thereof is more or less raised.

Thus, the NMOS transistor formed in the input-output protecting circuit section 45 according to the second mode of the third embodiment drops the punch through voltage while keeping the threshold voltage which is almost equal to that of the NMOS transistor formed in the internal circuit section 46. Therefore, it is possible to obtain an input-output protecting circuit having a high ESD resistance. The NMOS transistor formed in the internal circuit section 46 does not drop the punch through voltage. Therefore, a performance characteristic is not deteriorated due to a drop in the punch through voltage.

Others

While the first and second modes of the third embodiment have described the NMOS transistor as an example, it is needless to say that the present invention can also be applied to a PMOS transistor by reversing a conductivity type of each component.

In the first and second modes, the gate electrode 5p of the NMOS transistor of the input-output protecting circuit section 45 has a conductivity type of p. Even if the gate electrode 5p has a conductivity type of n in the same manner as in the gate electrode 5n of the NMOS transistor of the internal circuit section 46, the threshold voltage is dropped but an ESD resistance can be enhanced due to a drop in the punch through voltage.

By using the MOS transistor having the structure according to the first or second mode of the third embodiment as the NMOS transistors Q11 and Q12 and the PMOS transistors Q21 and Q22 according to the first embodiment shown in FIG. 1 or 2, the ESD resistance can be enhanced still more.

Fourth Embodiment

Principle

Figure 36:
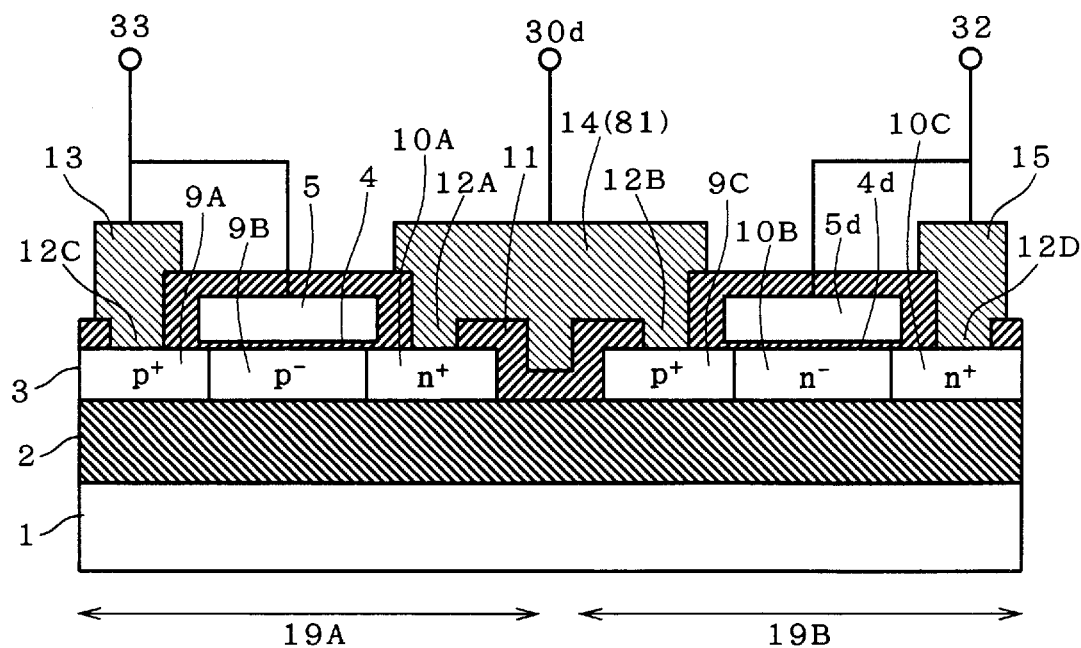
FIG. 36 is a sectional view showing a sectional structure of a part of the input-output protecting circuit in FIG. 32.

In the case where a diode should be formed on a SOI substrate together with a MOS transistor, a process of manufacturing a MOS transistor is generally utilized to form gate oxide films 4 and 4d and gate electrodes 5 and 5d in upper portions as shown in FIG. 36.

However, the gate oxide films 4 and 4d are easily caused to break down. Existence of the gate oxide films 4 and 4d causes a deterioration in an ESD resistance. In a fourth embodiment, an input-output protecting circuit is formed by using a diode having neither the gate oxide film nor the gate electrode provided on the SOI substrate.

Structure and Operation

Figure 10:
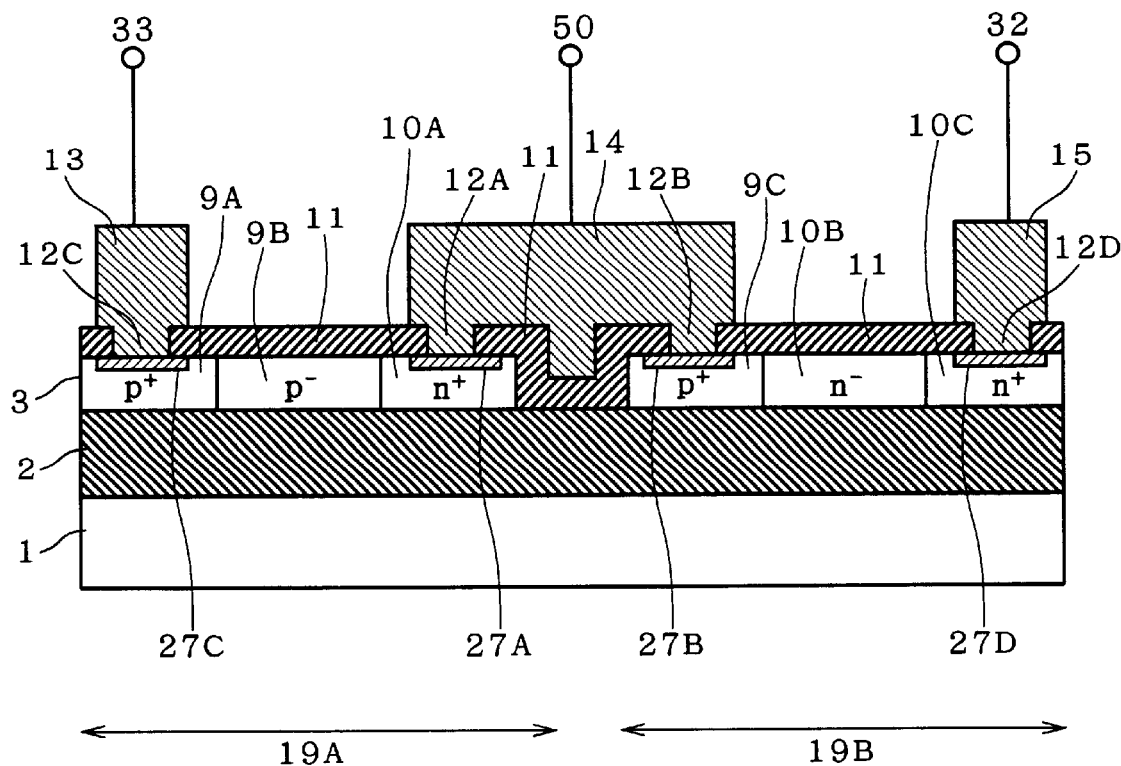
FIG. 10 is a sectional view showing a sectional structure of an input-output protecting circuit of a semiconductor device according to a fourth embodiment of the present invention.
Figure 11:
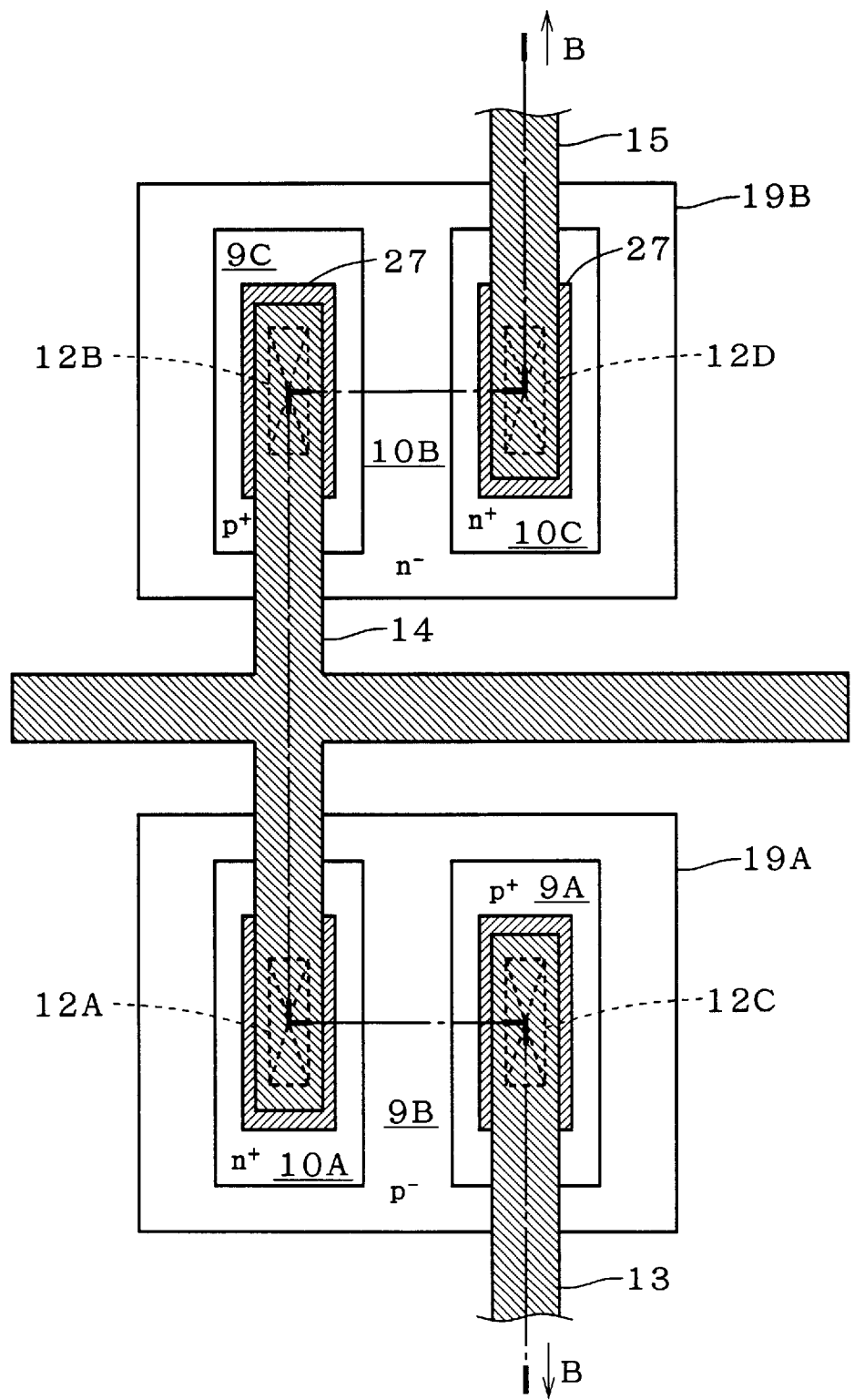
FIG. 11 is a plan view showing a planar structure according to the fourth embodiment in FIG. 10.

FIGS. 10 and 11 are sectional and plan views showing a structure of an input-output protecting circuit used for a semiconductor device according to the fourth embodiment of the present invention. FIG. 10 shows a section taken along the line B—B in FIG. 11. Diodes shown in FIGS. 10 and 11 correspond to the diodes 38 and 39 in FIG. 32 and the diodes D11 and D12 in FIG. 2, for example.

As shown in FIGS. 10 and 11, a thin silicon film 3 is provided on a silicon substrate 1 with a buried oxide film 2 acting as an insulation layer interposed therebetween. The thin silicon film 3 is divided into two islands 19A and 19B by an interlayer dielectric film 11. An anode region 9B into which a p-type impurity having a concentration of about $10^{17}/cm^3$ is implanted and a cathode region 10B into which an n-type impurity having a concentration of about $10^{17}/cm^3$ is implanted are provided, respectively. An anode region 9A and a cathode region 10A are provided with the anode region 9B interposed therebetween, and an anode region 9C and a cathode region 10C are provided with the cathode region 10B interposed therebetween. A p-type impurity having a concentration of about $10^{20}/cm^3$ is implanted into the anode regions 9A and 9C. An n-type impurity having a concentration of about $10^{20}/cm^3$ is implanted into the cathode regions 10A and 10C. Accordingly, a diode 39 is formed by the anode regions 9A and 9B and the cathode region 10A, and a diode 38 is formed by the anode region 9C and the cathode regions 10B and 10C.

Silicide regions 27A to 27D are selectively formed on surfaces of the cathode region 10A, the anode region 9C, the anode region 9A and the cathode region 10C, respectively.

The silicide regions 27A to 27D may be formed in self-alignment in openings which are provided on a part of the anode regions 9A and 9C and the cathode regions 10A and 10C after the anode regions 9A to 9C and the cathode regions 10A to 10C are formed and an insulation film is then deposited. No silicide region may be formed by covering the whole surface of an input-output protecting circuit section 45 with an insulation film during formation of silicide of an internal circuit section 46. After contact holes 12A to 12D are provided at a step of forming contact holes, a silicide region may selectively be formed on the surfaces of the cathode region 10A, the anode region 9C, the anode region 9A and the cathode region 10C through the contact holes 12A to 12D.

In addition, the interlayer dielectric film 11 divides the thin silicon film 3 into the islands 19A and 19B and is formed over the whole surface of the thin silicon film 3. The contact holes 12A to 12D are provided on the interlayer dielectric film 11 in a part of the silicide regions 27A to 27D, respectively. An aluminum wiring 14 is electrically connected to the silicide regions 27A and 27B through the contact holes 12A and 12B, an aluminum wiring 13 is electrically connected to the silicide region 27C through the contact hole 12C, and an aluminum wiring 15 is electrically connected to the silicide region 27D through the contact hole 12D. The aluminum wiring 13 is connected to a ground level 33, the aluminum wiring 14 is connected to an input terminal 50, and the aluminum wiring 15 is connected to a power supply 32. The input terminal 50 may be connected to the other end of the protecting resistor 36 shown in FIG. 32 or may directly receive an input signal IN. In FIG. 11, the interlayer dielectric film 11 is not shown.

Figure 32:
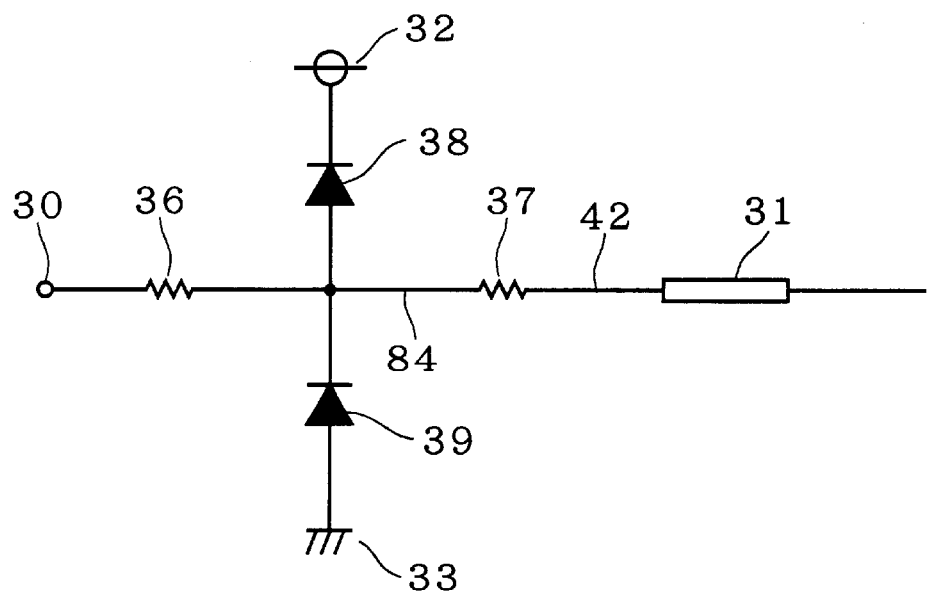
FIG. 32 is a circuit diagram showing a structure of the input-output protecting circuit according to the prior art.

In the input-output protecting circuit having such a structure according to the fourth embodiment, a junction between the anode region 9B and the cathode region 10A of the diode 39 breaks down due to application of a positive surge voltage and the surge voltage is discharged into the ground level 33 in the same manner as in the input-output protecting circuit according to the prior art shown in FIGS. 32 and 36. At the same time, the diode 38 is forward biased so that the surge voltage is discharged into the power supply 32. If a negative high voltage is applied as the surge voltage, a junction between the anode region 9C and the cathode region 10B of the diode 38 breaks down so that the surge voltage is discharged into the power supply 32. At the same time, the diode 39 is forward biased so that the surge voltage is discharged into the ground level 33.

In the diode used for the input-output protecting circuit according to the fourth embodiment, a gate oxide film which causes a deterioration in the ESD resistance is not formed in an upper portion. Consequently, it is possible to obtain the ESD resistance which is better than in the case where a diode having a conventional structure shown in FIG. 36 is used.

In addition, a contact resistance can be reduced by connecting the anode regions 9A and 9C and the cathode regions 10A and 10C to the aluminum wirings 13 to 15 by means of the suicide regions 27A to 27D.

Others

Furthermore, the ESD resistance can be enhanced still more by using the MOS transistor having the structure according to the fourth embodiment as the diodes D11 and D12 according to the second mode of the first embodiment shown in FIG. 2.

Fifth Embodiment

Principle

Figure 12:
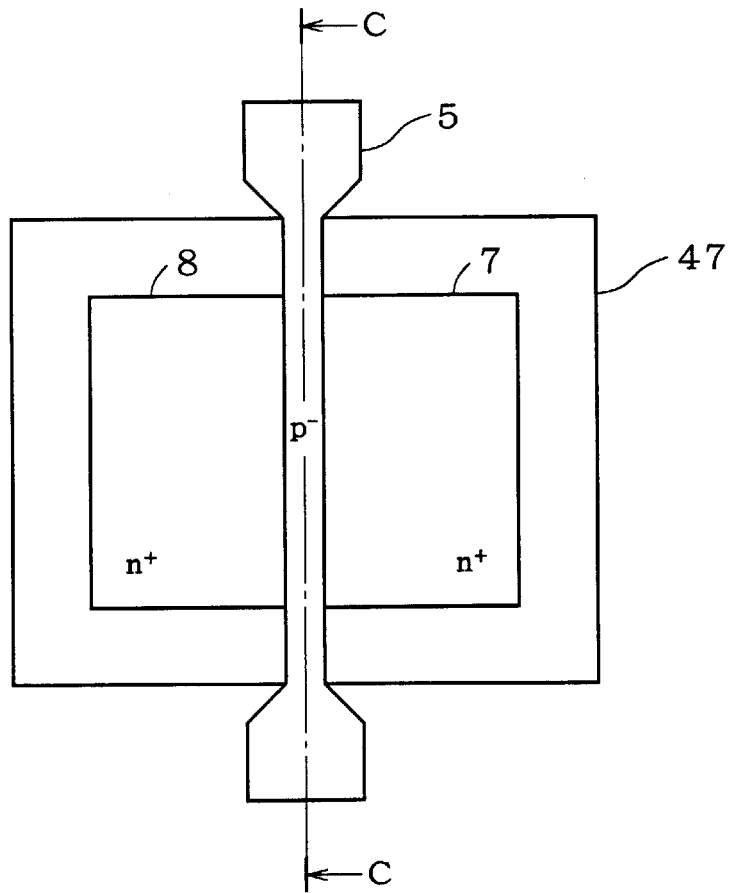
FIG. 12 is a plan view for explaining a principle of a fifth embodiment.
Figure 13:
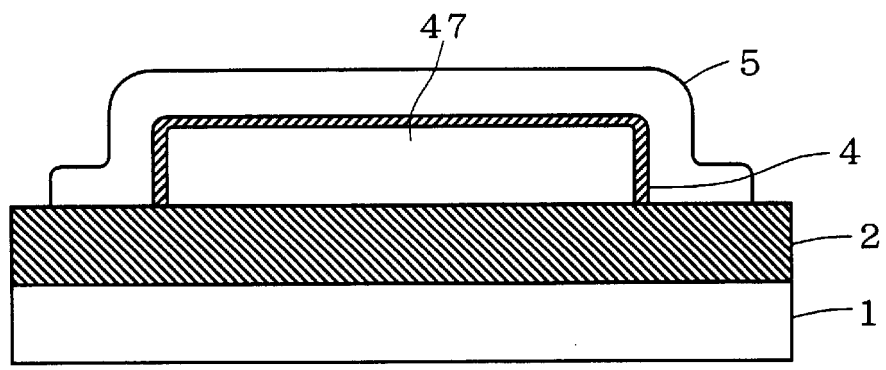
FIG. 13 is a sectional view for explaining the principle of the fifth embodiment.

In the case where a MOS transistor formed on a SOI substrate (including a capacitor and a diode including a gate electrode in an upper portion) has a planar structure in which a gate electrode 5 protrudes from an active region 47 (having a drain region 7 and a source region 8 therein) of a thin silicon film 3 as shown in a plan view of FIG. 12, the gate electrode 5 is formed to cover an end of the active region 47 (thin silicon film 3) provided like an island on an insulation layer 2 in FIG. 13 showing a C—C section of FIG. 12.

The end of the active region 47 has poor quality of crystals by etching damage caused during patterning of the active region 47. For this reason, quality of a gate oxide film 4 formed in a region in the vicinity of the end of the active region 47 is originally poor. Therefore, when the gate electrode 5 is formed to cover the end of the active region 47, a greater stress is generated on the end of the active region 47. Consequently, the quality of the gate oxide film 4 on the end of the active region 47 is further deteriorated. As a result, the ESD resistance is degraded.

In a fifth embodiment, an input-output protecting circuit is formed by using a MOS transistor including, on a SOI substrate, a gate electrode having a planar structure in which the gate electrode does not protrude from an active region of a thin silicon film 3.

First Mode

Figure 14:
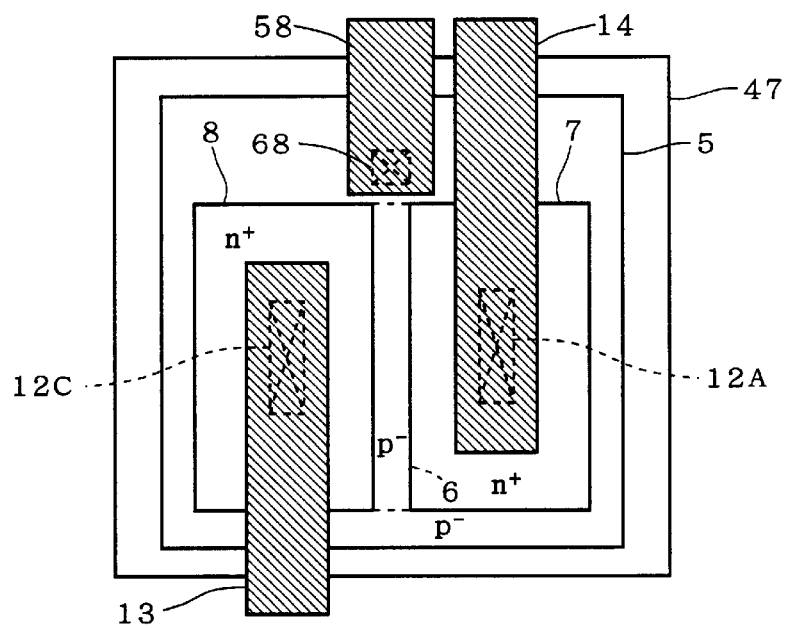
FIG. 14 is a plan view showing a planar structure of an input-output protecting circuit of a semiconductor device according to a first mode of the fifth embodiment of the present invention.

FIG. 14 is a plan view showing a planar structure of a MOS transistor used for an input-output protecting circuit of a semiconductor device according to a first mode of the fifth embodiment of the present invention. As shown in FIG. 14, a gate electrode 5 is formed like a "8" shape having two openings therein. A drain region 7 and a source region 8 are formed in the two openings. An aluminum wiring 14 is electrically connected to the drain region 7 through a contact hole 12A, an aluminum wiring 13 is electrically connected to the source region 8 through a contact hole 12C, and an aluminum wiring 58 is electrically connected to the gate electrode 5 through a contact hole 68. The planar structure shown in FIG. 14 can be applied to the NMOS transistor formed on the island 20A in the first mode of the second embodiment shown in FIG. 5, for example.

According to the first mode of the fifth embodiment, thus, the gate electrode 5 is formed in an active region 47 on a plane. Therefore, the gate electrode 5 is not formed on an end of the active region 47 so that an ESD resistance can correspondingly be enhanced.

Second Mode

Figure 15:
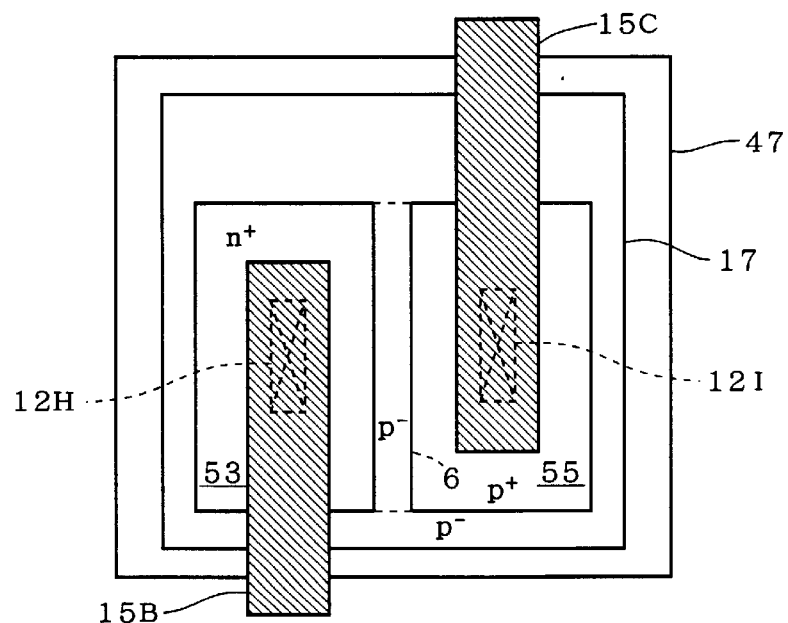
FIG. 15 is a plan view showing a planar structure according to a second mode of the fifth embodiment.

FIG. 15 is a plan view showing a planar structure of a MOS transistor used for an input-output protecting circuit of a semiconductor device according to a second mode of the fifth embodiment of the present invention. As shown in FIG. 15, a gate electrode 17 is formed like a "8" shape having two openings therein. An n-type diffusing region 53 and a p-type diffusing region 55 are formed in the two openings. An aluminum wiring, 15B is electrically connected to the n-type diffusing region 53 through a contact hole 12H, and an aluminum wiring 15C is electrically connected to the p-type diffusing region 55 through a contact hole 12I. The planar structure shown in FIG. 15 can be applied to a capacitor having a gate coupling structure in which the gate electrode 17 formed on the island 20B in the third mode of the second embodiment shown in FIG. 7 is set in a floating state, for example.

According to the second mode of the fifth embodiment, thus, the gate electrode 17 is formed in an active region 47 on a plane. Therefore, the gate electrode 17 is not formed on an end of the active region 47 so that an ESD resistance can correspondingly be enhanced.

Third Mode

Figure 16:
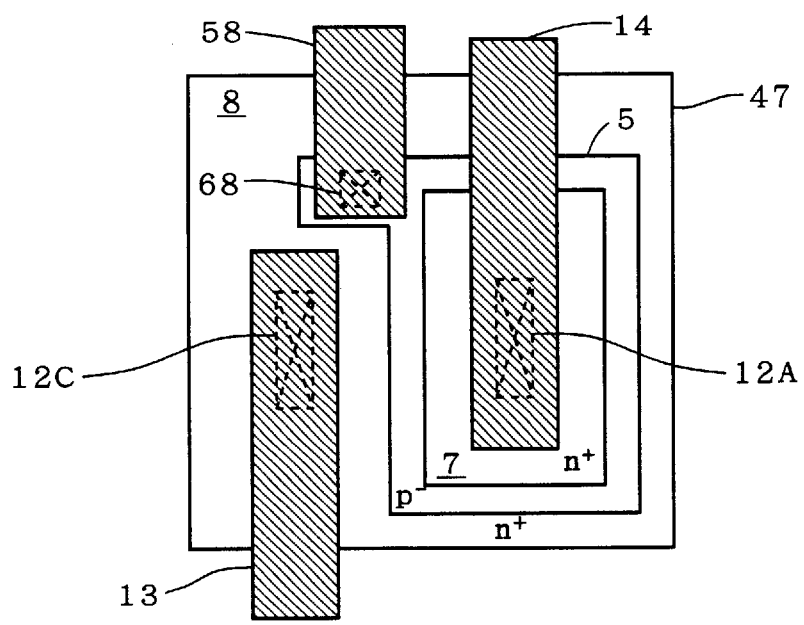
FIG. 16 is a plan view showing a planar structure according to a third mode of the fifth embodiment.

FIG. 16 is a plan view showing a planar structure of a MOS transistor used for an input-output protecting circuit of a semiconductor device according to a third mode of the fifth embodiment of the present invention. As shown in FIG. 16, a gate electrode 5 is formed like a "O" shape enclosing one opening therein. A drain region 7 is formed in the opening and a source region 8 is formed in an active region 47 on the outside of the gate electrode 5. An aluminum wiring 14 is electrically connected to the drain region 7 through a contact hole 12A, an aluminum wiring 13 is electrically connected to the source region 8 through a contact hole 12C, and an aluminum wiring 58 is electrically connected to the gate electrode 5 through a contact hole 68. The planar structure shown in FIG. 16 can be applied to the NMOS transistor formed on the island 20A in the first mode of the second embodiment shown in FIG. 5, for example.

According to the third mode of the fifth embodiment, thus, the gate electrode 5 is formed in the active region 47 on a plane. Therefore, the gate electrode 5 is not formed on an end of the active region 47 so that an ESD resistance can correspondingly be enhanced.

Fourth Mode

Figure 17:
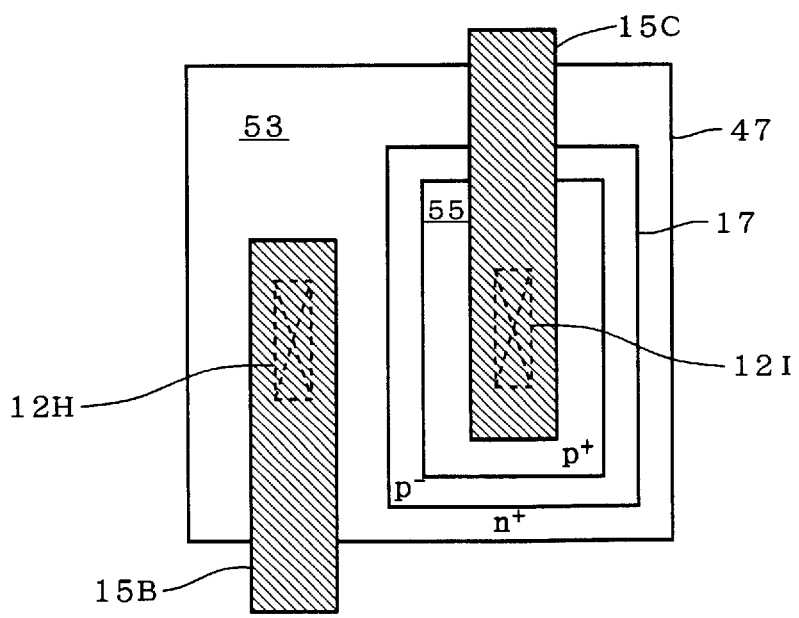
FIG. 17 is a plan view showing a planar structure according to a fourth mode of the fifth embodiment.

FIG. 17 is a plan view showing a planar structure of a MOS transistor used for an input-output protecting circuit of a semiconductor device according to a fourth mode of the fifth embodiment of the present invention. As shown in FIG. 17, a gate electrode 17 is formed like a "O" shape enclosing one opening therein. A p-type diffusing region 55 is formed in the opening and an n-type diffusing region 53 is formed in an active region 47 on the outside of the gate electrode 17. An aluminum wiring 15B is electrically connected to the n-type diffusing, region 53 through a contact hole 12H, and an aluminum wiring 15C is electrically connected to the p-type diffusing region 55 through a contact hole 12I. The planar structure shown in FIG. 17 can be applied to a capacitor in which the gate electrode 17 formed on the island 20B in the third mode of the second embodiment shown in FIG. 7 is set in a floating state, for example.

According to the fourth mode of the fifth embodiment, thus, the gate electrode 17 is formed in the active region 47 on a plane. Therefore, the gate electrode 17 is not formed on an end of the active region 47 so that an ESD resistance can correspondingly be enhanced.

Others

By using the MOS transistor having the structure according to the first or third mode of the fifth embodiment as the NMOS transistors Q11 and Q12 and the PMOS transistors Q21 and Q22 according to the first embodiment shown in FIG. 1 or 2, the ESD resistance can be enhanced still more.

Supplement

While the NMOS transistor has mainly been described in the structures according to the second to fifth embodiments, it is needless to say that the present invention can be applied to a PMOS transistor by reversing a conductivity type. While the structure in which a PMOS transistor is provided on a power supply 32 side and an NMOS transistor is provided on a ground level 33 side has principally been described, a structure in which a MOS transistor for input-output protection is provided on one of the power supply 32 and the ground level 33 can also have the same effects. Also in the case where a MOS transistor is diode connected, the NMOS transistor is provided on the power supply 32 side and the PMOS transistor is provided on the ground level 33 side, the same effects can be obtained.

It is needless to say that the same effects as in the above-mentioned embodiments are at least obtained even if various kinds of MOS transistors and diodes are combined and connected to form a complicated input-output protecting circuit.

While the invention has been described in detail, the foregoing description is in all aspects illustrative and not restrictive. It is understood that numerous other modifications and variations can be devised without departing from the scope of the invention.

We claim:

1. A semiconductor device having an input-output protecting circuit section corresponding to a signal node connected to a signal terminal, and an internal circuit connected to said signal node, which are formed on a SOI substrate, comprising:

a power supply node connected to a supply potential; and a reference potential node connected to a reference potential, said input-output protecting circuit section including:

first and second discharge elements being provided between said power supply node and said signal node and having PN junctions and being reversely biased when a normal operation signal with a potential between said supply potential and said reference potential is applied to said signal terminal, said first discharge element being forward biased when a surge voltage having a first polarity is applied to said signal terminal, said second discharge element being forward biased when a surge voltage having a second polarity is applied to said signal terminal; and third and fourth discharge elements being provided between said signal node and said reference potential node and having PN junctions and being reversely biased when said normal operation signal is applied to said signal terminal, respectively, said third discharge element being forward biased when said surge voltage having the first polarity is applied to said signal terminal, said fourth discharge element being forward biased when said surge voltage having the second polarity is applied to said signal terminal.

2. The semiconductor device according to claim 1, wherein said first and third discharge elements include first and third MOS transistors of a first conductivity type, said second and fourth discharge elements include second and fourth MOS transistors of a second conductivity type, said first and third MOS transistors have control electrodes connected to said reference potential node respectively, and said second and fourth MOS transistors have control electrodes connected to said power supply node respectively.

3. The semiconductor device according to claim 2, wherein said supply potential is higher than said reference potential, said first conductivity type is N, said second conductivity type is P, said first polarity is negative, and said second polarity is positive.

4. The semiconductor device according to claim 2, further comprising:
   a first internal resistor inserted between said signal terminal and said signal node; and
   a second internal resistor inserted between said signal node and said internal circuit.

5. The semiconductor device according to claim 1, wherein said first discharge element includes a MOS transistor of a first conductivity type and has a control electrode connected to said reference potential node, said second and third discharge elements include diodes, and said fourth discharge element includes a MOS transistor of a second conductivity type and has a control electrode connected to said power supply node.

6. The semiconductor device according to claim 5, wherein said supply potential is higher than said reference potential, said first conductivity type is N, said second conductivity type is P, said first polarity is negative, and said second polarity is positive.

7. The semiconductor device according to claim 5, further comprising:
   a first internal resistor inserted between said signal terminal and said signal node; and
   a second internal resistor inserted between said signal node and said internal circuit.

8. A semiconductor device comprising:
   a SOI substrate:
   an input-output protecting circuit section connected to a signal terminal, configured to protect an internal circuit and formed on said SOI substrate; and
   a potential fixing node which is one of a power supply node and a reference potential node
   said input-output protecting circuit section including:
   a MOS transistor of a predetermined conductivity type having a first electrode region connected to said signal terminal and a second electrode region connected to said potential fixing node;
   a first capacitor inserted between said first electrode region and a gate electrode of said MOS transistor;
   a second capacitor inserted between said potential fixing node and said gate electrode of said MOS transistor; and
   a pseudo MOS transistor section comprising a pseudo gate electrode, a pseudo gate insulation film, and first, second and third diffusing regions corresponding to said gate electrode of said MOS transistor, a gate insulation film, a channel formation region, said first electrode region and said second electrode region respectively, and does not function as a transistor,
   wherein said first capacitor includes a capacitor formed by a part of said gate electrode of said MOS transistor and a part of said first electrode region with said gate insulation film interposed therebetween,
   wherein said second capacitor includes a capacitor formed between said pseudo gate electrode and said channel formation region of said pseudo MOS transistor, and
   wherein a capacity value of said second capacitor is set greater than that of said first capacitor in such a manner that said MOS transistor is reversely biased when said normal operation signal is applied to said signal terminal, and is forward biased when a surge voltage having a first or second polarity is applied to said signal terminal.

9. The semiconductor device according to claim 8, wherein said first and second diffusing regions have the same conductivity type, said second diffusing region is connected to said potential fixing node, and said pseudo gate electrode is connected to said gate electrode of said MOS transistor in said pseudo MOS transistor section, and
   wherein said second capacitor includes a capacitor formed by said pseudo gate electrode and said first diffusing region with said pseudo gate insulation film interposed therebetween.

10. The semiconductor device according to claim 8, wherein said first diffusing region has a conductivity type which is different from that of said second diffusing region, said second and third diffusing regions have the same conductivity type, said third diffusing region is connected to said potential fixing node, and said pseudo gate electrode is connected to said gate electrode of said MOS transistor in said pseudo MOS transistor section, and
   wherein said second capacitor includes a capacitor formed by said pseudo gate electrode and said first diffusing region with said pseudo gate insulation film interposed therebetween.

11. The semiconductor device according to claim 8, wherein said first diffusing region has a conductivity type which is different from that of said second diffusing region, said first and third diffusing regions have the same conductivity type, said third diffusing region is connected to said potential fixing node, and said second diffusing region is connected to said gate electrode of said MOS transistor in said pseudo MOS transistor section, and
   wherein said second capacitor includes a capacitor formed by a PN junction of said first diffusing region and said second diffusing region.

12. A semiconductor device comprising:
   an SOI substrate;
   an input-output protecting circuit section comprising a MOS transistor for input-output protection formed on said SOI substrate; and
   an internal circuit section comprising a MOS transistor for an internal circuit formed on said SOI substrate and configured to perform a predetermined signal processing;
   wherein said MOS transistor for input-output protection has a structure in which punch through is caused more easily than in said MOS transistor for an internal circuit.

13. The semiconductor device according to claim 12, wherein an impurity concentration of a channel formation region of said MOS transistor for input-output protection is set lower than that of a channel formation region of said MOS transistor for an internal circuit.

14. The semiconductor device according to claim 13, wherein said MOS transistor for input-output protection and said MOS transistor for an internal circuit have the same conductivity type, and a conductivity type of a gate electrode of said MOS transistor for input-output protection is made different from that of a gate electrode of said MOS transistor for an internal circuit to set a threshold voltage of said MOS transistor for input-output protection almost equal to that of said MOS transistor for an internal circuit.

15. The semiconductor device according to claim 12, wherein a conductivity type of a channel formation region of said MOS transistor for input-output protection is set identical to that of each of a drain region and a source region thereof, and a conductivity type of a channel formation region of said MOS transistor for an internal circuit is set different from that of each of a drain region and a source region thereof.

16. The semiconductor device according to claim 15, wherein said MOS transistor for input-output protection and said MOS transistor for an internal circuit have the same conductivity type, and a conductivity type of a gate electrode of said MOS transistor for input-output protection is made different from that of a gate electrode of said MOS transistor for an internal circuit to set a threshold voltage of said MOS transistor for input-output protection almost equal to that of said MOS transistor for an internal circuit.

17. A semiconductor device comprising an input-output protecting circuit section having a MOS transistor for input-output protection formed on an active region provided on a SOI substrate, wherein a gate electrode of said MOS transistor for input-output protection is formed within said active region on a plane, and wherein said gate electrode does not protrude from said active region.

18. A semiconductor device comprising an input-output protecting circuit section formed on a SOI substrate and having first and second diodes connected to a signal terminal, said input-output protecting circuit section including:

a first semiconductor region of a first conductivity type;

a second semiconductor region of a second conductivity type formed adjacently to said first semiconductor region;

a third semiconductor region of the first conductivity type formed independent of said first and second semiconductor regions;

a fourth semiconductor region of the second conductivity type formed adjacently to said third semiconductor region;

first to fourth silicide regions which are selectively formed on surfaces of said first to fourth semiconductor regions, respectively;

an interlayer dielectric film formed by covering said first to fourth semiconductor regions including said first to fourth silicide regions, said interlayer dielectric film having first and fourth openings formed on said first to fourth silicide regions, respectively;

a first wiring layer connected to a reference potential and formed on said first silicide region through said first opening of said interlayer dielectric film;

a second wiring layer connected to said signal terminal and formed on said second and third silicide regions through said first and second openings of said interlayer dielectric film; and a third wiring layer connected to a power supply and formed on said fourth silicide region through said fourth opening of said interlayer dielectric film, wherein said first diode is formed by said first and second semiconductor regions, and said second diode is formed by said third and fourth semiconductor regions.

* * * * *